(12) United States Patent
Okano

(10) Patent No.: US 11,476,263 B2
(45) Date of Patent: Oct. 18, 2022

(54) SEMICONDUCTOR DEVICE

(71) Applicant: Kioxia Corporation, Tokyo (JP)

(72) Inventor: Kimitoshi Okano, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 133 days.

(21) Appl. No.: 17/011,011

(22) Filed: Sep. 3, 2020

(65) Prior Publication Data

US 2021/0082930 A1 Mar. 18, 2021

(30) Foreign Application Priority Data

Sep. 18, 2019 (JP) .............................. JP2019-169564
Feb. 25, 2020 (JP) .............................. JP2020-029110

(51) Int. Cl.
*H01L 29/94* (2006.01)
*H01L 27/11529* (2017.01)
*H01L 49/02* (2006.01)
*H01L 27/11573* (2017.01)

(52) U.S. Cl.
CPC .. *H01L 27/11529* (2013.01); *H01L 27/11573* (2013.01); *H01L 28/90* (2013.01)

(58) Field of Classification Search
CPC ............................ H01L 27/11573; H01L 28/90
See application file for complete search history.

(56) References Cited

U.S. PATENT DOCUMENTS

| | | | |
|---|---|---|---|
| 6,232,154 B1 | 5/2001 | Reith et al. | |
| 6,700,790 B2 | 3/2004 | Tanaka et al. | |
| 9,691,684 B2 | 6/2017 | Park et al. | |
| 2007/0001203 A1 | 1/2007 | Lehr et al. | |
| 2016/0268445 A1* | 9/2016 | Amo | H01L 27/0629 |

FOREIGN PATENT DOCUMENTS

| | | |
|---|---|---|
| JP | 2007-012694 A | 1/2007 |
| TW | I406391 B | 8/2013 |

* cited by examiner

*Primary Examiner* — Samuel A Gebremariam
(74) *Attorney, Agent, or Firm* — Foley & Lardner LLP

(57) ABSTRACT

A semiconductor device includes: a semiconductor substrate; a first semiconductor layer; a first conductor; a first power supply line; a second power supply line; and a circuit. The semiconductor substrate has a first surface, a second surface facing the first surface, and a third surface disposed between the first surface and the second surface. The first semiconductor layer is disposed along the first surface from the third surface. The first conductor is disposed on the first semiconductor layer. The first power supply line is electrically connected to the first conductor. The second power supply line is electrically connected to the semiconductor substrate. The circuit is disposed on the semiconductor substrate and connected to the first power supply line and the second power supply line.

24 Claims, 30 Drawing Sheets

FIG. 17
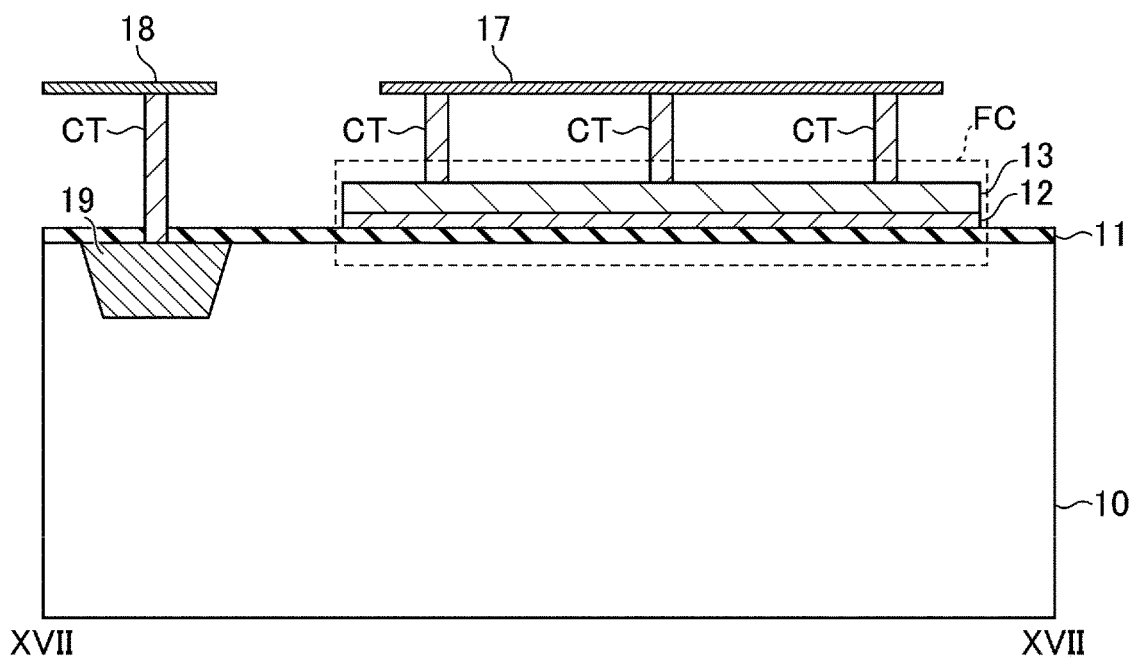
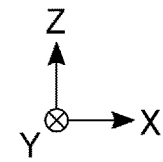
FIG. 18
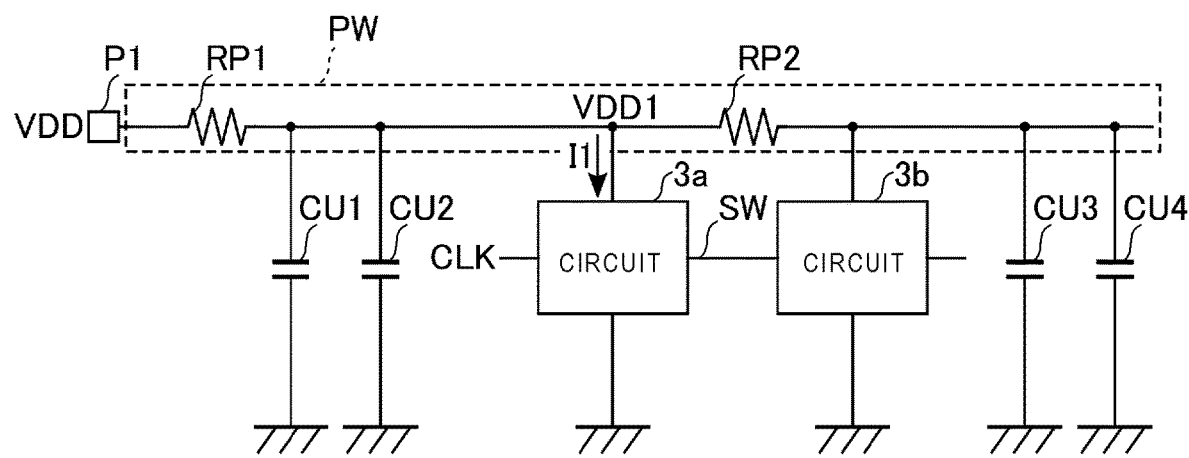

FIG. 23
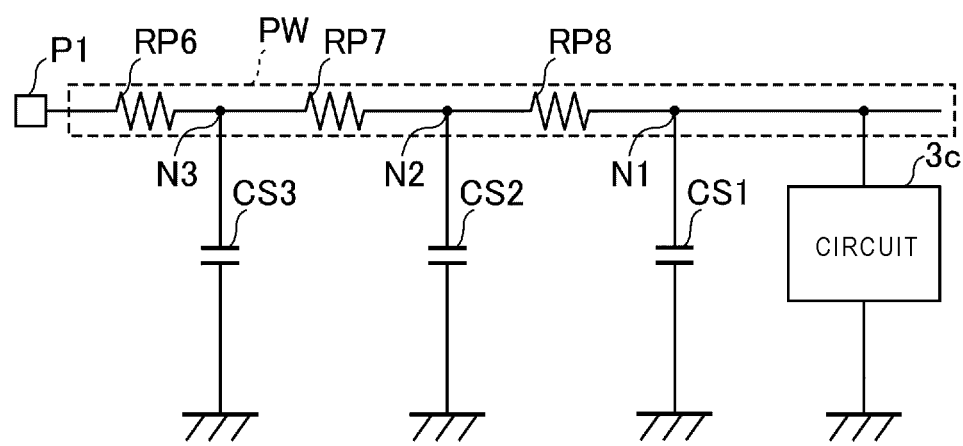
FIG. 24
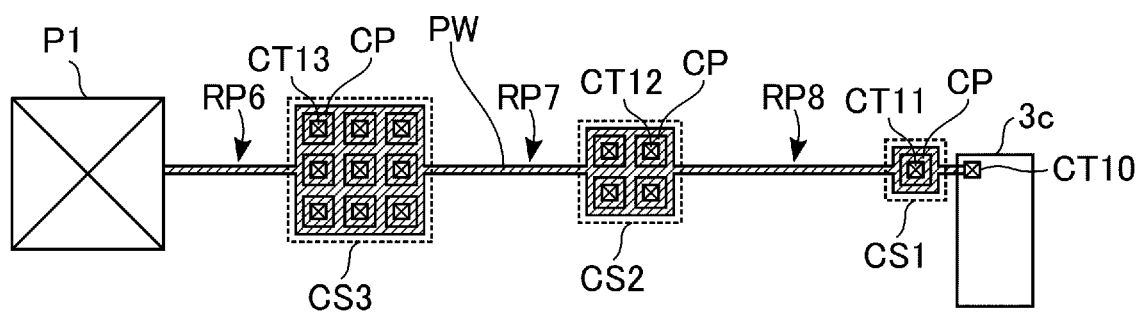
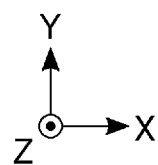

SEMICONDUCTOR DEVICE

CROSS-REFERENCE TO RELATED APPLICATION(S)

This application is based upon and claims the benefit of priority from Japanese Patent Application Nos. 2019-169564, filed Sep. 18, 2019 and 2020-029110, filed Feb. 25, 2020, the entire contents of which are incorporated herein by reference.

FIELD

Embodiments described herein relate generally to a semiconductor device including a bypass capacitor.

BACKGROUND

It is known that a bypass capacitor is provided on a semiconductor substrate in order to reduce fluctuation of a power supply voltage.

DESCRIPTION OF THE DRAWINGS

FIG. 17 is a cross-sectional view showing an example of a cross-sectional structure of the capacitor area along a line XVII-XVII in FIG. 16.

FIG. 18 is a block diagram showing a configuration example of the semiconductor device according to a second embodiment.

FIG. 23 is a block diagram showing a configuration example of the semiconductor device according to a third embodiment.

FIG. 24 is a plan view showing an example of a planar layout of the semiconductor device according to the third embodiment.

DETAILED DESCRIPTION

Figure 1:
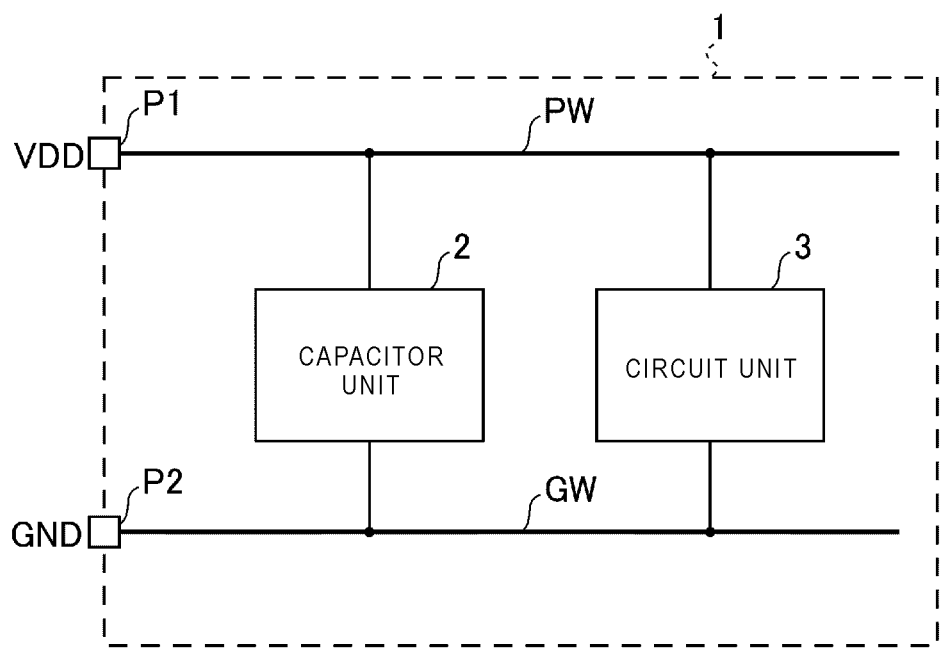
FIG. 1 is a block diagram showing a configuration example of a semiconductor device according to a first embodiment.

At least one embodiment provides a semiconductor device in which an increase in an area of the semiconductor substrate is prevented.

In general, according to at least one embodiment, a semiconductor device according to at least one embodiment includes: a semiconductor substrate; a first semiconductor layer; a first conductor; a first power supply line; a second power supply line; and a circuit. The semiconductor substrate has a first surface, a second surface facing the first surface, and a third surface provided between the first surface and the second surface. The first semiconductor layer is disposed along the first surface from the third surface. The first conductor is disposed on the first semiconductor layer. The first power supply line is electrically connected to the first conductor. The second power supply line is electrically connected to the semiconductor substrate. The circuit is disposed on the semiconductor substrate and connected to the first power supply line and the second power supply line.

Hereinafter, embodiments will be described with reference to the drawings. The embodiments illustrate a device and method for embodying technical idea. The drawings are schematic or conceptual, and the dimensions and ratios of the drawings are not necessarily the same as actual ones. The technical ideas is not limited by a shape, structure, arrangement, and the like of the elements.

In the following description, the elements having substantially the same functions and configurations are indicated by the same reference numerals. The number after a letter that makes up the reference numeral is referenced by a reference numeral that includes the same letter and is used to distinguish between elements that have similar configurations. When it is not necessary to distinguish elements indicated by the reference numerals that include the same letter from each other, each of the elements is referenced by a reference numeral containing only letter.

[1] First Embodiment

A semiconductor device 1 according to the first embodiment will be described below.

[1-1] Configuration of Semiconductor Device 1

[1-1-1] Overall Configuration of Semiconductor Device 1

FIG. 1 shows a structural example of the semiconductor device 1 according to the first embodiment. The semiconductor device 1 is integrated on, for example, one semiconductor substrate. As shown in FIG. 1, the semiconductor device 1 includes power supply lines PW and GW, pads P1 and P2, a capacitor unit 2, and a circuit unit 3.

Each of the power supply lines PW and GW is used to supply a power supply voltage to each circuit in the semiconductor device 1. Each of the pads P1 and P2 is configured to be connectable to a device outside the semiconductor device 1. The pad P1 is a power supply pad on a positive side of the semiconductor device 1, and is connected to the power supply line PW. A power supply voltage VDD, for example, is applied to the pad P1. The pad P2 is a power supply pad on a negative side of the semiconductor device 1, and is connected to the power supply line GW. The pad P2 is connected to, for example, a ground node GND.

The capacitor unit 2 is connected between the power supply line PW and the power supply line GW. The capacitor unit 2 prevents a voltage of the power supply line PW from fluctuating. The circuit unit 3 is connected to the power supply lines PW and GW. The circuit unit 3 includes a circuit that operates based on a voltage supplied via the power supply line PW. A circuit in the circuit unit 3 may be, for example, a peripheral circuit of a NAND flash memory.

Figure 2:
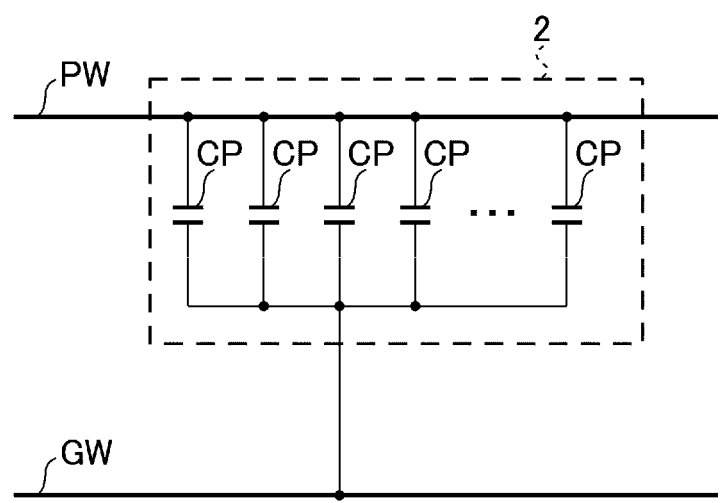
FIG. 2 is a circuit diagram showing a configuration example of a capacitor unit of the semiconductor device according to the first embodiment.

FIG. 2 shows an example of a configuration of the capacitor unit 2 of the semiconductor device 1 according to the first embodiment. As shown in FIG. 2, the capacitor unit 2 includes, for example, a plurality of capacitors CPs. In each of the plurality of capacitors CP, one electrode is connected to the power supply line PW, and the other electrode is connected to the power supply line GW. That is, the plurality of capacitors CP are connected in parallel between the power supply lines PW and GW. Each of the plurality of capacitors CP is also referred to as, for example, a bypass capacitor.

[1-1-2] Structure of Semiconductor Device 1

An example of a structure of the capacitor unit 2 in the first embodiment will be described below.

In the drawings referenced below, a plane determined by an X direction and a Y direction corresponds to a surface of a semiconductor substrate 10 on which the semiconductor device 1 is formed, and a Z direction corresponds to a vertical direction with respect to the surface of the semiconductor substrate 10 on which the semiconductor device 1 is formed. For easy understanding of the drawing, hatching is appropriately added to a plan view. The hatching added to the plan view is not necessarily associated with a material or a characteristic of an element to which hatching is added. In a cross-sectional view, elements such as an insulating layer (interlayer insulating film), a wiring, and a contact are appropriately omitted for easy understanding of the drawing.

In the following description, an area including the capacitor CP in the capacitor unit 2 on the semiconductor substrate 10 is referred to as a capacitor area CA. An area including a transistor in the circuit unit 3 on the semiconductor substrate 10 is referred to as a transistor area TA.

Figure 3:
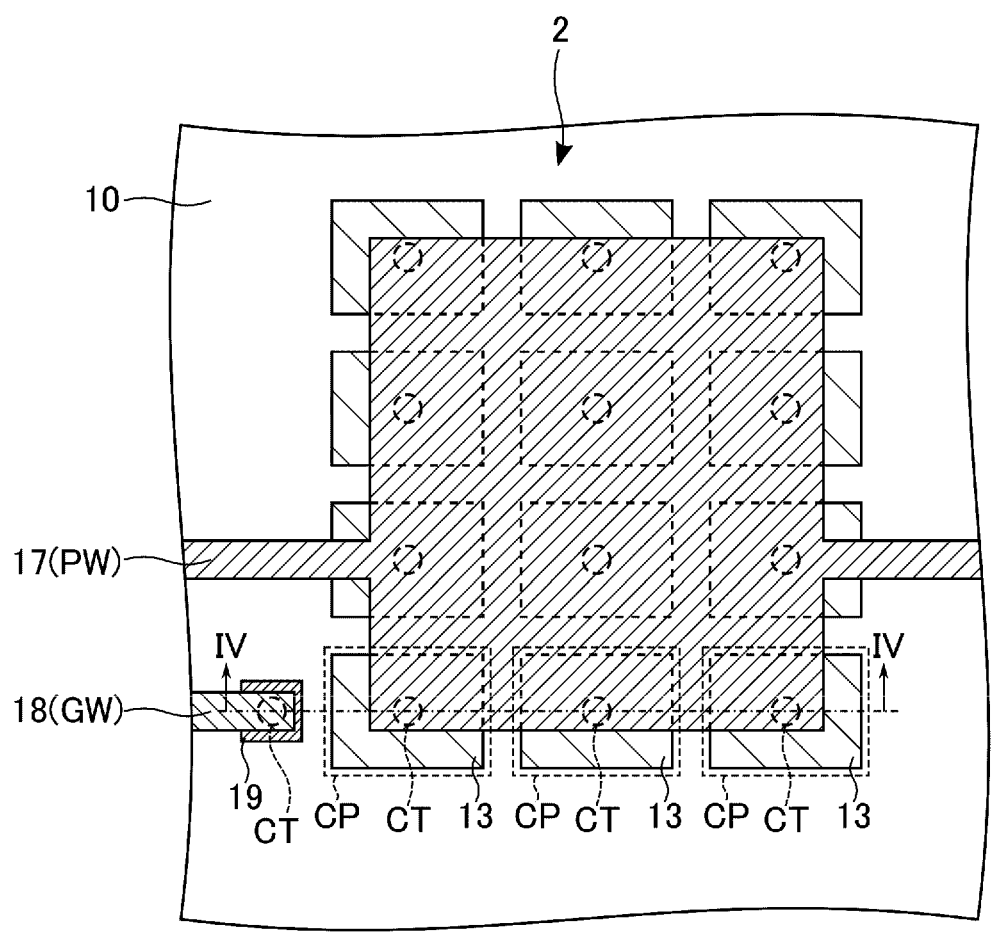
FIG. 3 is a plan view showing an example of a planar layout in a capacitor area of the semiconductor device according to the first embodiment.

FIG. 3 shows an example of a planar layout in the capacitor area CA of the semiconductor device 1 according to the first embodiment. As shown in FIG. 3, the capacitor unit 2 includes a plurality of conductors 13, conductors 17 and 18, a diffusion area 19, and a plurality of contacts CT.

Each of the conductors 13 corresponds to one electrode of one capacitor CP. The plurality of conductors 13 are arranged in a matrix of, for example, 4 rows and 3 columns. The conductor 17 overlaps each of the conductors 13. The conductor 17 functions as the power supply line PW. Each of the conductors 13 is electrically connected to the conductor 17 via the contact CT.

The diffusion area 19 is provided on the surface of the semiconductor substrate 10. The diffusion area 19 may be, for example, a P-type diffusion area and is electrically connected to the semiconductor substrate 10. The conductor 18 overlaps the diffusion area 19. The conductor 18 functions as the power supply line GW. The diffusion area 19 is electrically connected to the conductor 18 via the contact CT.

The number and arrangement of the capacitors CP are not limited to the example shown in FIG. 3. An area of the diffusion area 19 and a positional relationship with the conductor 13 are not limited to the example shown in FIG. 3.

Figure 4:
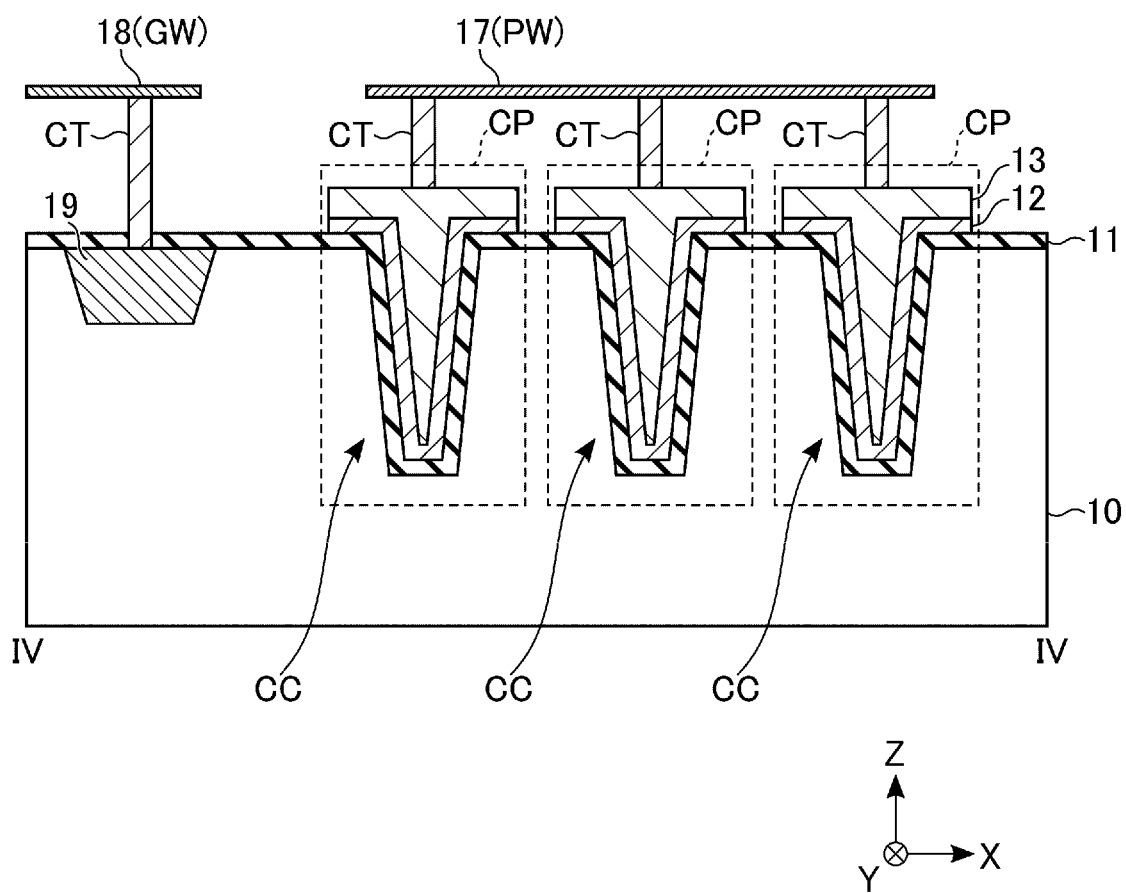
FIG. 4 is a cross-sectional view showing an example of a cross-sectional structure of the capacitor area along aline IV-IV in FIG. 3.

FIG. 4 is a cross-sectional view along a line IV-IV in FIG. 3, and shows an example of a cross-sectional structure of the capacitor area CA of the semiconductor device 1 according to the first embodiment. As shown in FIG. 4, the semiconductor device 1 further includes an insulator layer 11 and a semiconductor layer 12. The semiconductor substrate 10 includes a plurality of concave portions CC.

The insulator layer 11 is provided on the surface of the semiconductor substrate 10 and side surfaces and bottom portions of the concave portions CC. The insulator layer 11 provided on the surface of the semiconductor substrate 10 and the insulator layer 11 provided in the concave portions CC are continuously provided. The semiconductor layer 12 is provided on the insulator layer 11 in an area corresponding to each capacitor CP. The semiconductor layer 12 has portions provided along the concave portion CC, and where the portions are separated, for example, between adjacent concave portions CC. The conductor 13 is provided on the semiconductor layer 12. The concave portions CC are filled with the conductors 13. In the area corresponding to each capacitor CP, side surfaces of the semiconductor layer 12 and the conductor 13 are aligned.

With this configuration, in each concave portion CC, the semiconductor layer 12 and the conductor 13 function as one electrode of the capacitor CP, the insulator layer 11 functions as an insulator between electrodes of the capacitor CP, and the semiconductor substrate 10 functions as the other electrode of the capacitor CP. One electrode of the capacitor CP is connected to the conductor 17 functioning as the power supply line PW via the contact CT. The semiconductor substrate 10 functioning as the other electrode of the capacitor CP is connected to the conductor 18 functioning as the power supply line GW via the diffusion area 19 and the contact CT.

Figure 5:
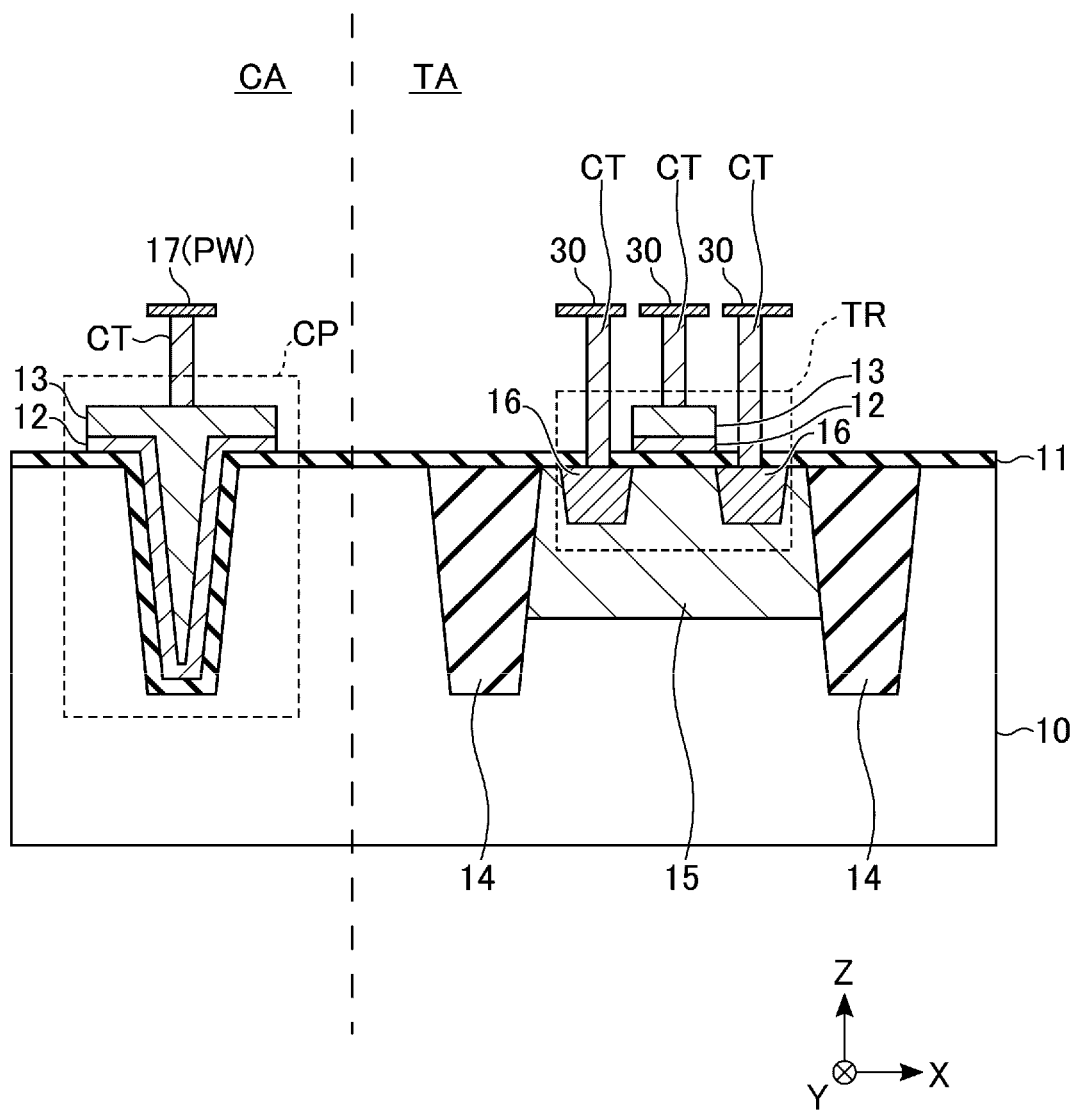
FIG. 5 is a cross-sectional view showing an example of a cross-sectional structure of a transistor area of the semiconductor device according to the first embodiment.

FIG. 5 shows an example of a cross-sectional structure of the transistor area TA of the semiconductor device 1 according to the first embodiment. An area shown in FIG. 5 includes a part of the capacitor area CA. As shown in FIG. 5, the transistor area TA includes, for example, a transistor TR. In the transistor area TA, the semiconductor device 1 further includes an insulator 14, a well area 15, a diffusion area 16, and a conductor 30.

The insulator 14 is formed inside the semiconductor substrate 10, and an upper end thereof is in contact with an upper surface of the semiconductor substrate 10. The insulator 14 is used as an insulating area, which may be shallow trench isolation (STI), between adjacent well regions, and partitions a part of the semiconductor substrate 10 in the transistor area TA. The well area 15 is formed in an area inside the semiconductor substrate 10 and partitioned by the insulator 14, and an upper end thereof is in contact with the upper surface of the semiconductor substrate 10. The two diffusion areas 16 are formed inside the well area 15, and upper ends thereof are in contact with the upper surface of the semiconductor substrate 10.

A plurality of conductors 30 are provided above the well area 15. Each of the plurality of conductors 30 is a wiring corresponding to a drain, a source, and a gate of the transistor TR. Each of the two diffusion areas 16 functions as a drain or a source of the transistor TR. Each of the two diffusion areas 16 is electrically connected to a corresponding conductor 30 via the contact CT. The semiconductor layer 12 is provided above the well area 15 and on the insulator layer 11. The conductor 13 is provided on the semiconductor layer 12. The semiconductor layer 12 and the conductor 13 function as a gate electrode of the transistor TR. A set of the semiconductor layer 12 and the conductor 13 is electrically connected to the conductor 30 via the contact CT.

[1-2] Manufacturing Method

Figure 6:
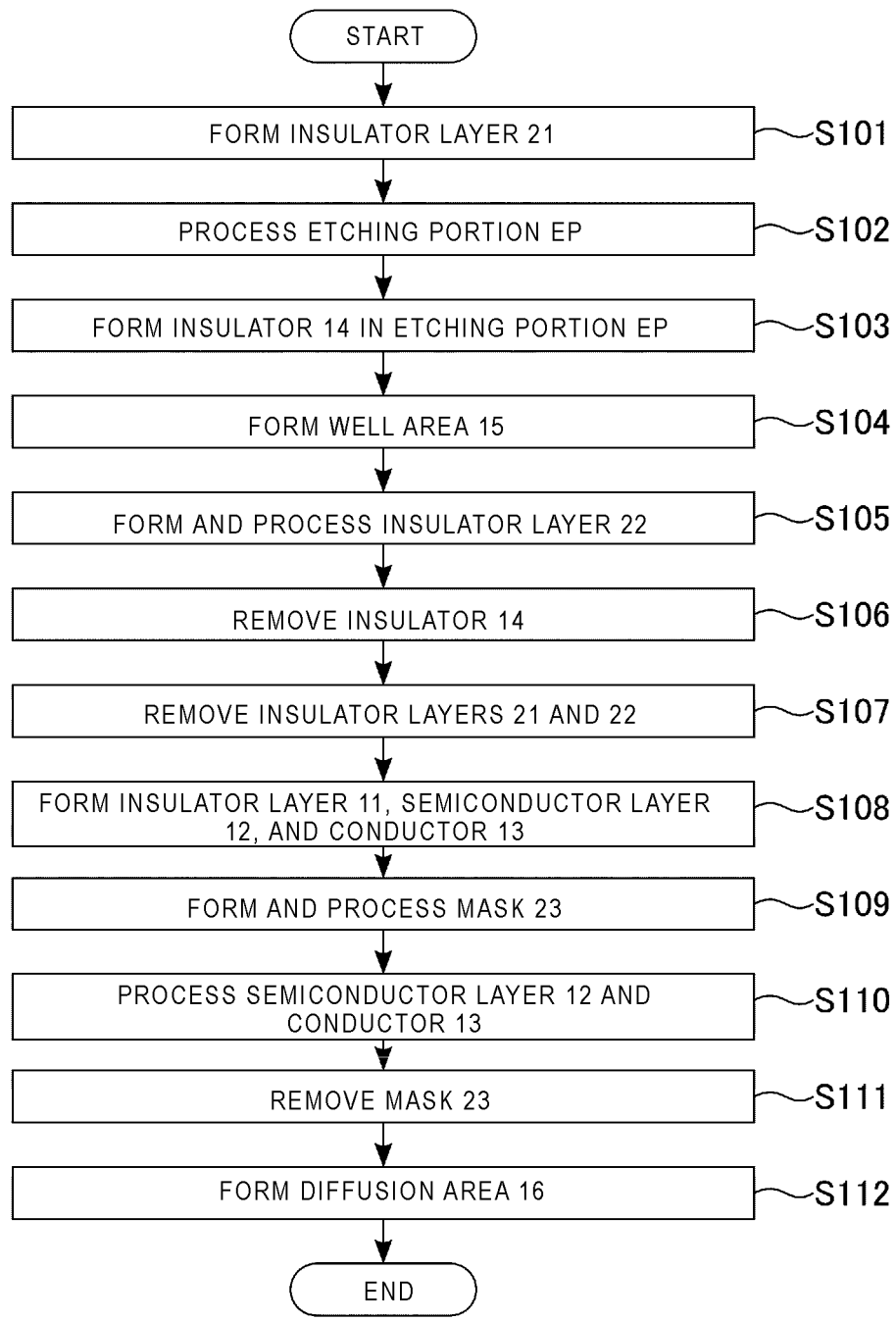
FIG. 6 is a flowchart showing an example of a manufacturing process of the semiconductor device according to the first embodiment.

Hereinafter, an example of a series of manufacturing processes until the capacitor CP and the transistor TR according to the first embodiment are formed will be described with reference to FIG. 6 as appropriate. FIG. 6 is a flowchart showing an example of a manufacturing process of the semiconductor device 1 according to the first embodiment. Each of FIGS. 7 to 15 shows an example of a cross-sectional structure including a structure corresponding to the capacitor CP and the transistor TR in the manufacturing process of the semiconductor device 1 according to the first embodiment.

Figure 7:
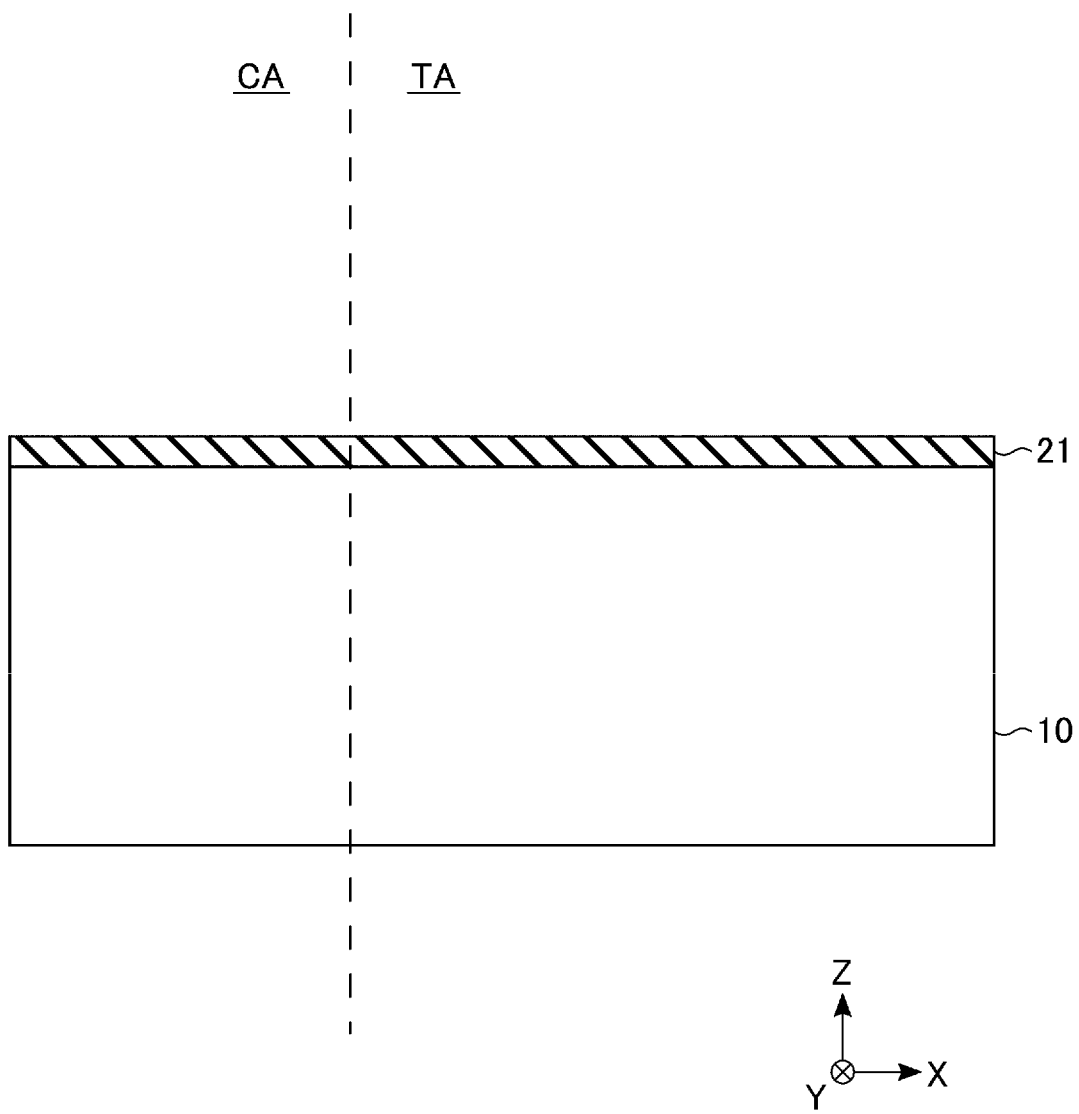
FIG. 7 is a cross-sectional view showing an example of the manufacturing process of the semiconductor device according to the first embodiment.

First, as shown in FIG. 7, an insulator layer 21 is formed on the semiconductor substrate 10 (step S101). The insulator layer 21 includes, for example, silicon nitride (SiN).

Figure 8:
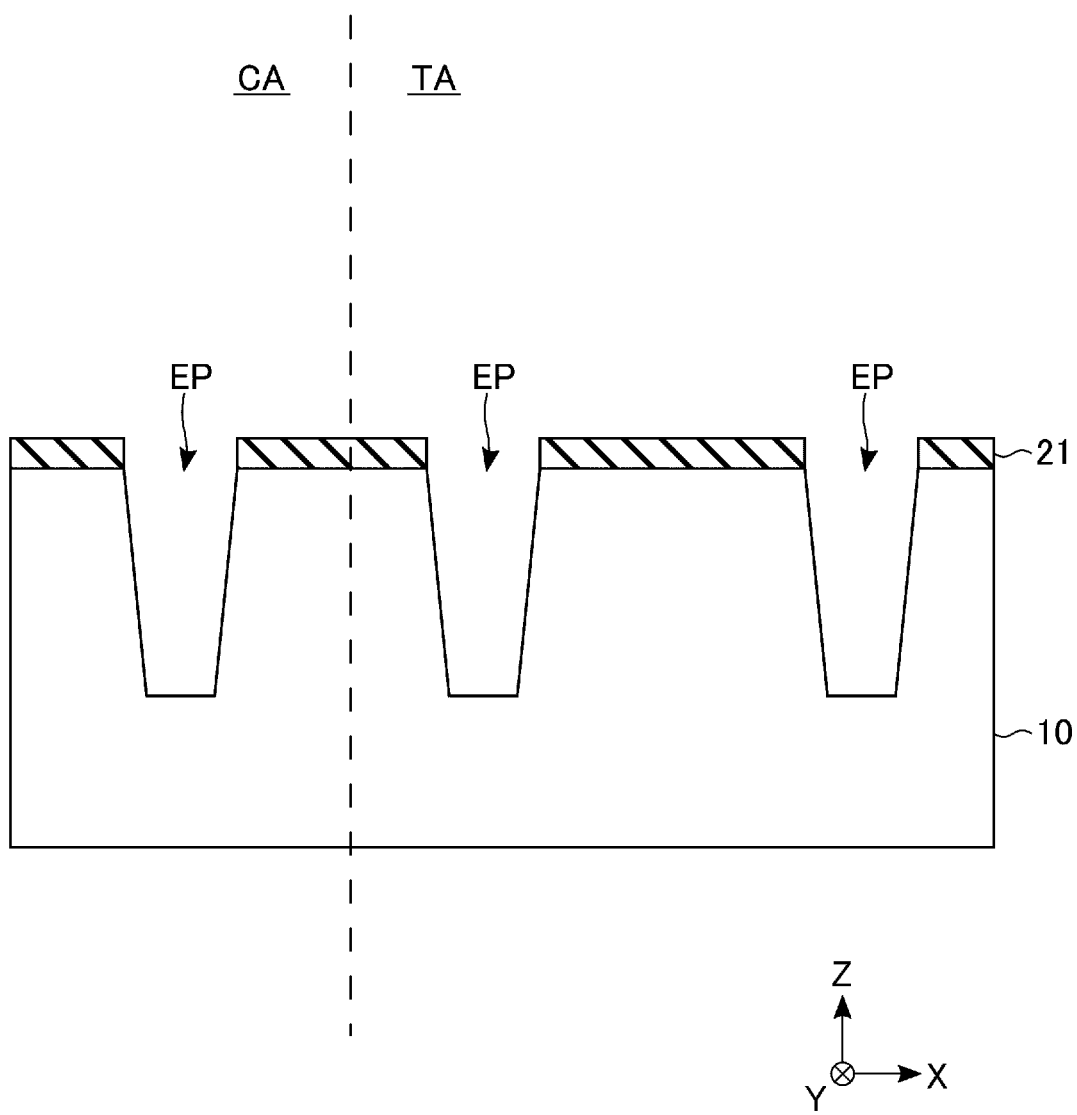
FIG. 8 is a cross-sectional view showing an example of the manufacturing process of the semiconductor device according to the first embodiment.

Next, as shown in FIG. 8, an etching portion EP is processed (step S102). Specifically, first, a mask in which an area corresponding to the etching portion EP is opened is formed by photolithography or the like. Then, the etching portion EP is formed by anisotropic etching using the formed mask. The etching portion EP formed in this process penetrates the insulator layer 21 and stops in the semiconductor substrate 10. The etching portion EP formed in the transistor area TA has a groove shape extending in a Y-axis direction. The etching portion EP formed in the capacitor area CA has a shorter length in the Y-axis direction than the etching portion EP provided in the transistor area, and has, for example, a hole shape. The anisotropic etching in this process may be, for example, reactive ion etching (RIE).

Figure 9:
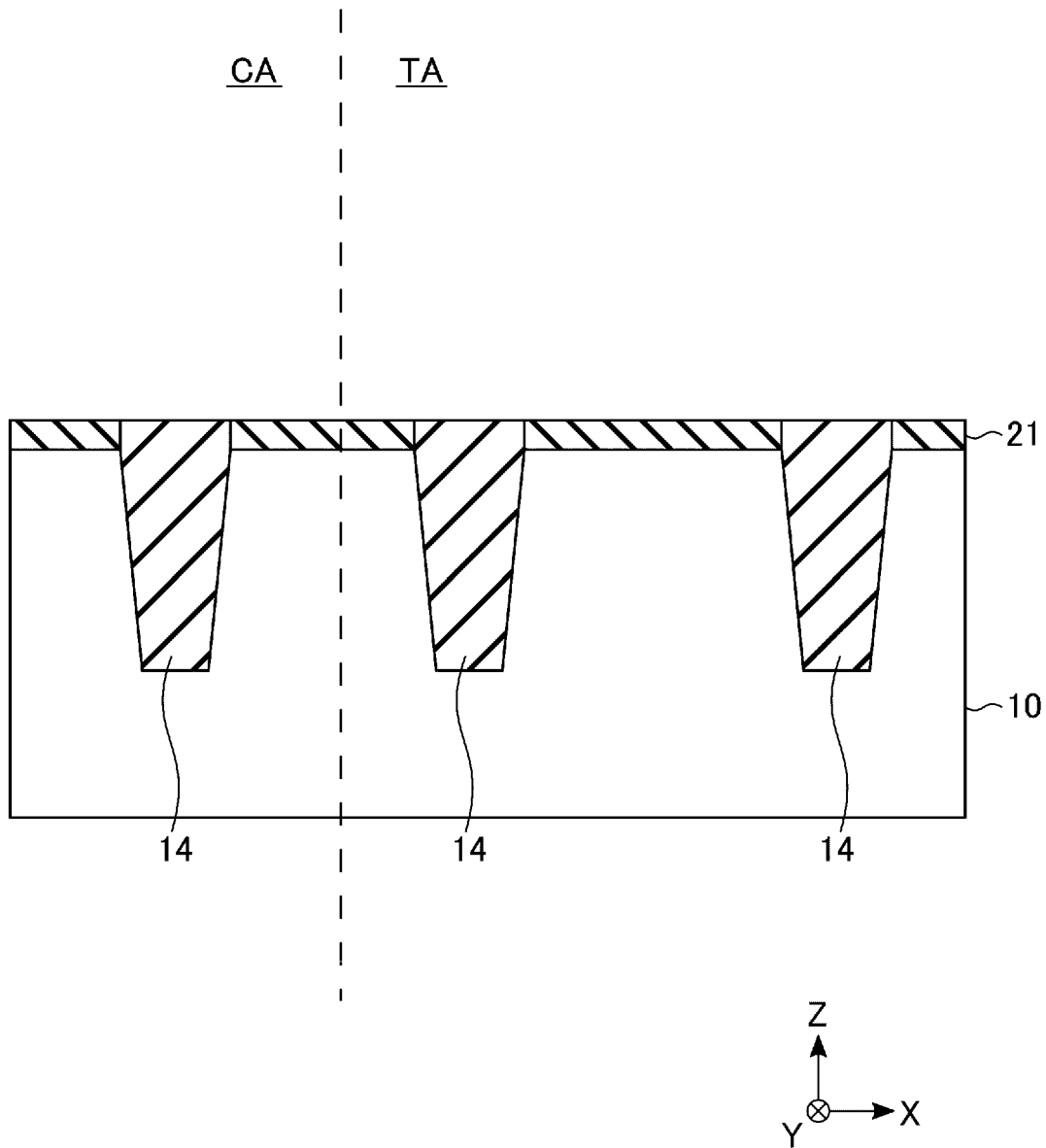
FIG. 9 is a cross-sectional view showing an example of the manufacturing process of the semiconductor device according to the first embodiment.

Next, as shown in FIG. 9, the insulator 14 is formed (step S103). Specifically, first, the insulator 14 is formed so as to fill up the etching portion EP. Then, the insulator 14 formed outside the etching portion EP is removed by, for example, chemical mechanical polishing (CMP). The insulator 14 includes, for example, silicon oxide ($SiO_2$).

Figure 10:
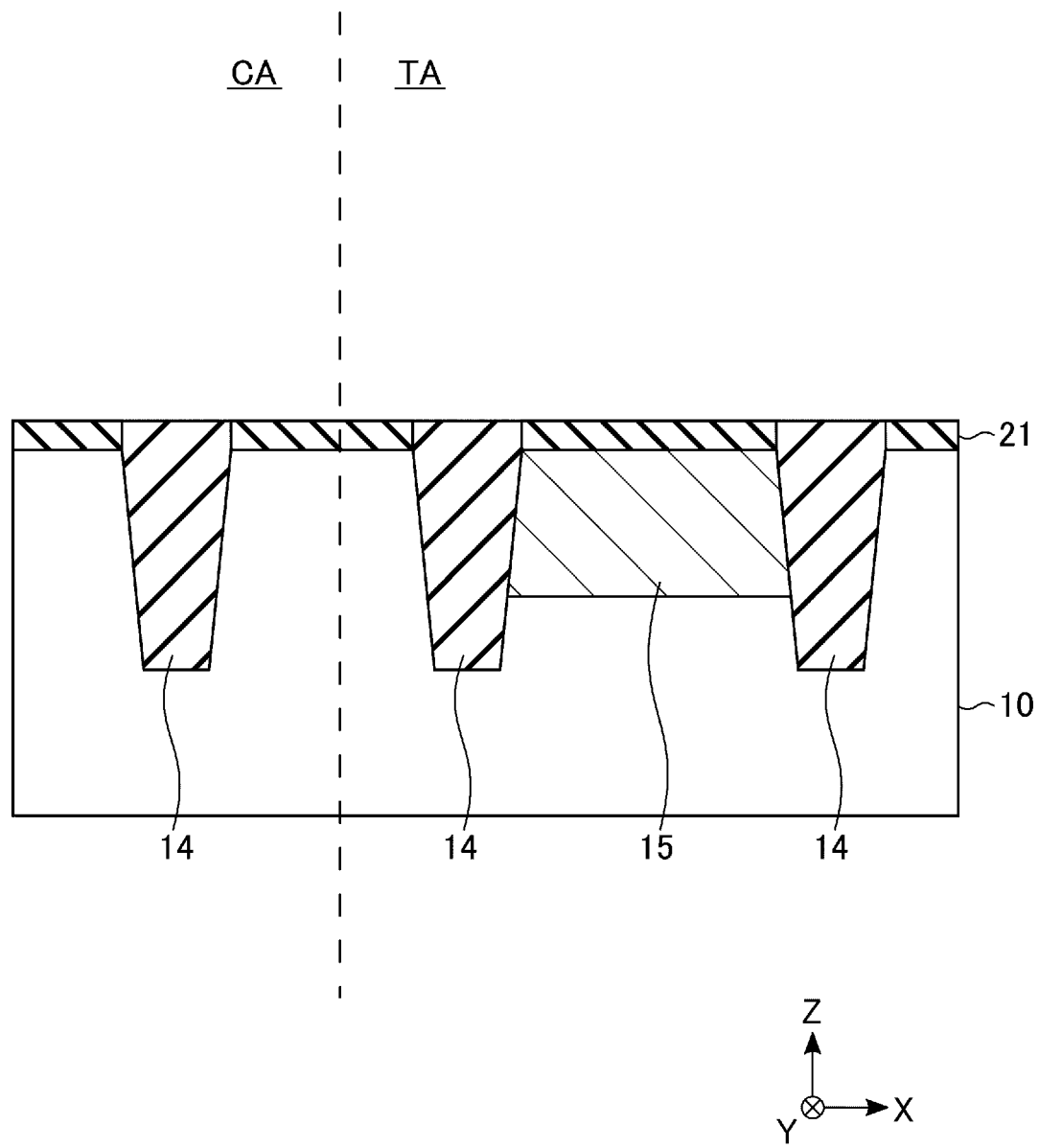
FIG. 10 is a cross-sectional view showing an example of the manufacturing process of the semiconductor device according to the first embodiment.

Next, as shown in FIG. 10, the well area 15 is formed (step S104). Specifically, in the transistor area TA, for example, phosphorus is doped in the area partitioned by the insulators 14 to form the well area 15.

Next, an insulator layer 22 is formed so as to cover the insulators 14 of the transistor area TA (step S105). Specifically, first, the insulator layer 22 is formed on the insulator layer 21 and the insulators 14. The insulator layer 22 includes, for example, silicon nitride. Subsequently, a mask in which an area corresponding to the capacitor area CA is opened is formed by the photolithography or the like. Then, the insulator layer 22 formed in the capacitor area CA is removed by the anisotropic etching using the formed mask. The anisotropic etching in this process may be, for example, RIE.

Figure 11:
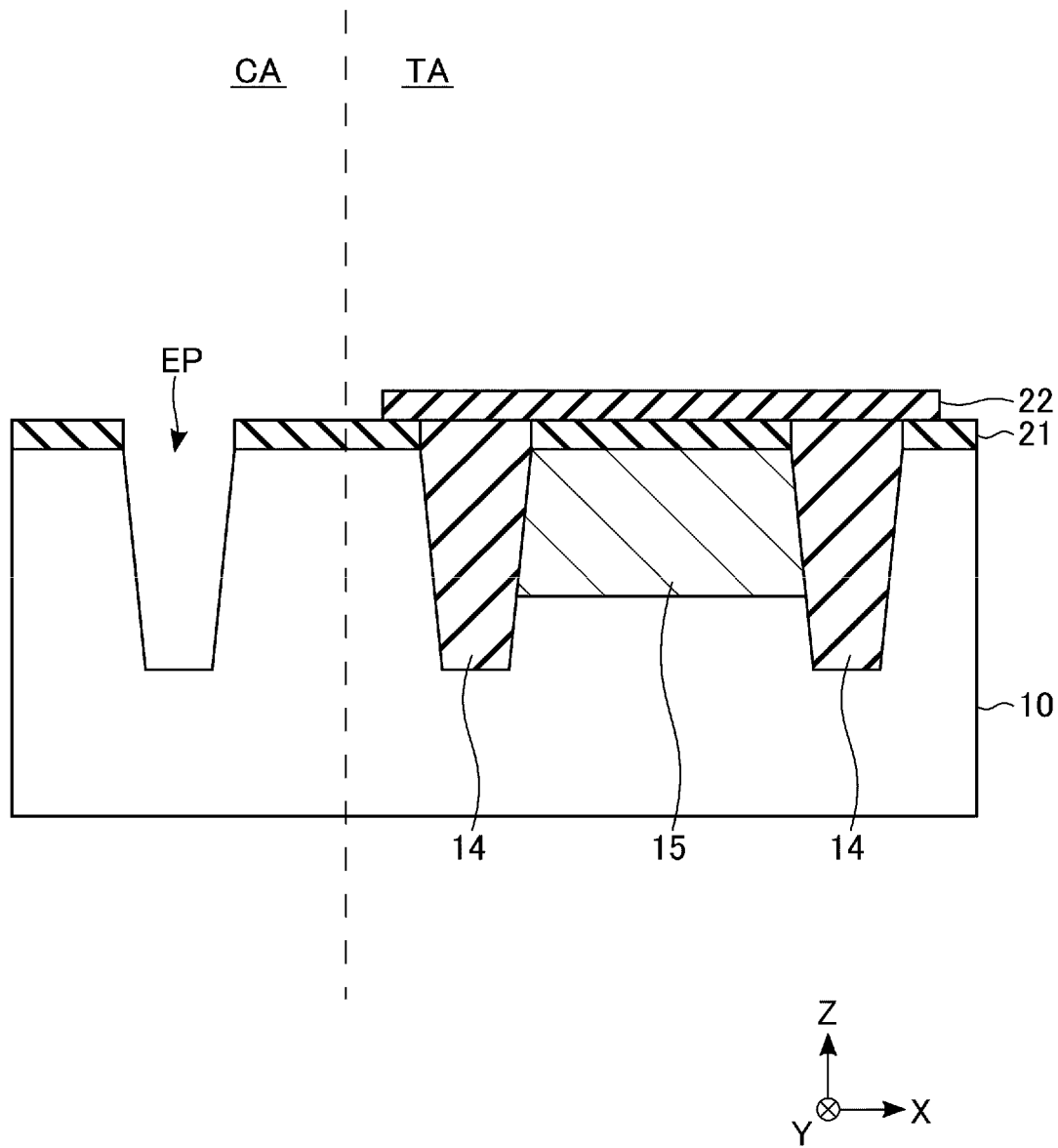
FIG. 11 is a cross-sectional view showing an example of the manufacturing process of the semiconductor device according to the first embodiment.

Next, as shown in FIG. 11, the insulator 14 of the capacitor area CA is removed (step S106). Specifically, the insulator 14 not covered by the insulator layer 22 in the capacitor area CA is removed by, for example, wet etching, and the etching portion EP in the capacitor area CA is exposed.

Figure 12:
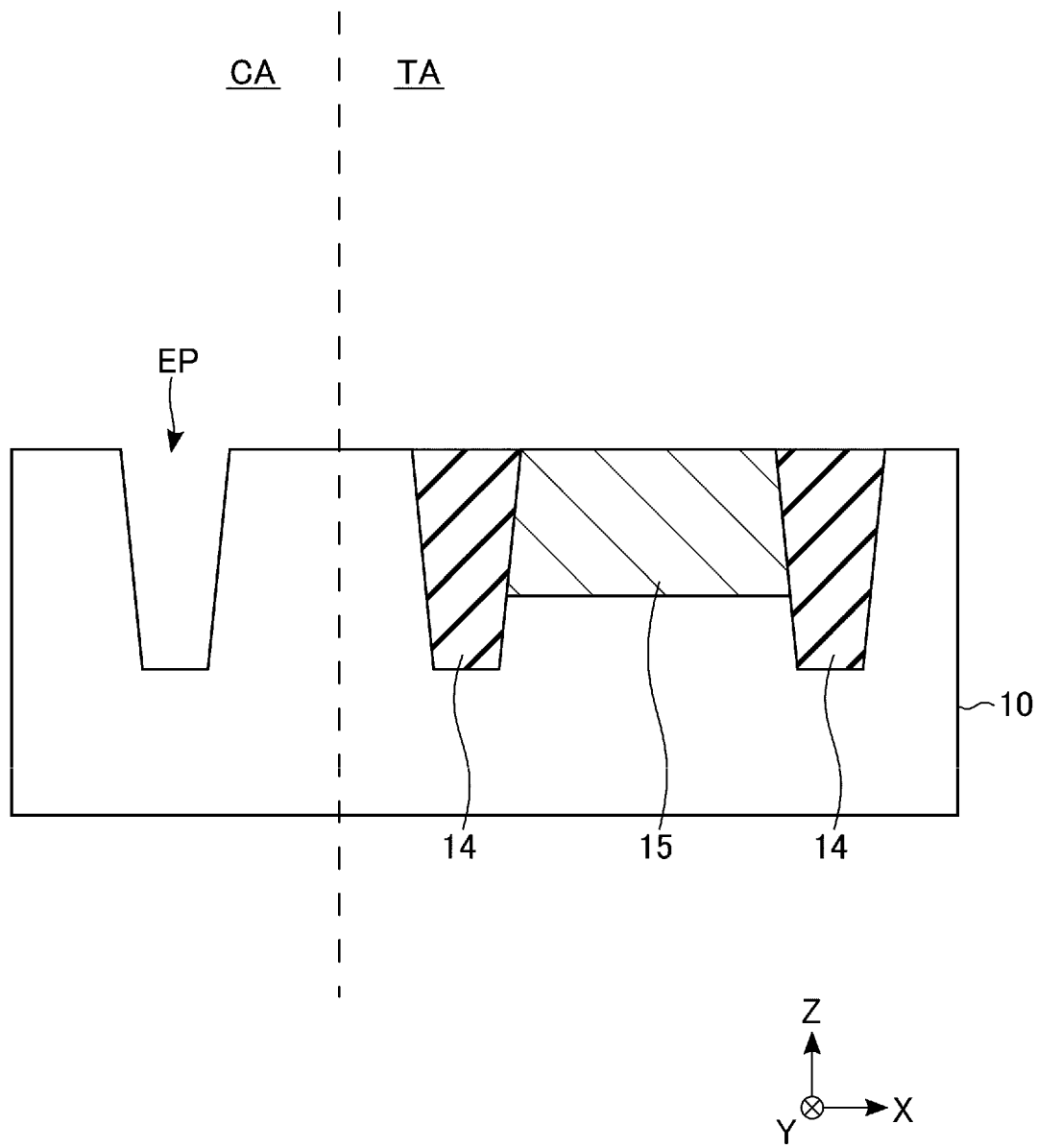
FIG. 12 is a cross-sectional view showing an example of the manufacturing process of the semiconductor device according to the first embodiment.

Next, as shown in FIG. 12, the insulator layers 21 and are removed (step S107). Specifically, the insulator layers 21 and 22 are removed by, for example, the wet etching. Then, the insulator 14 protruding from the semiconductor substrate 10 is removed by, for example, CMP.

Figure 13:
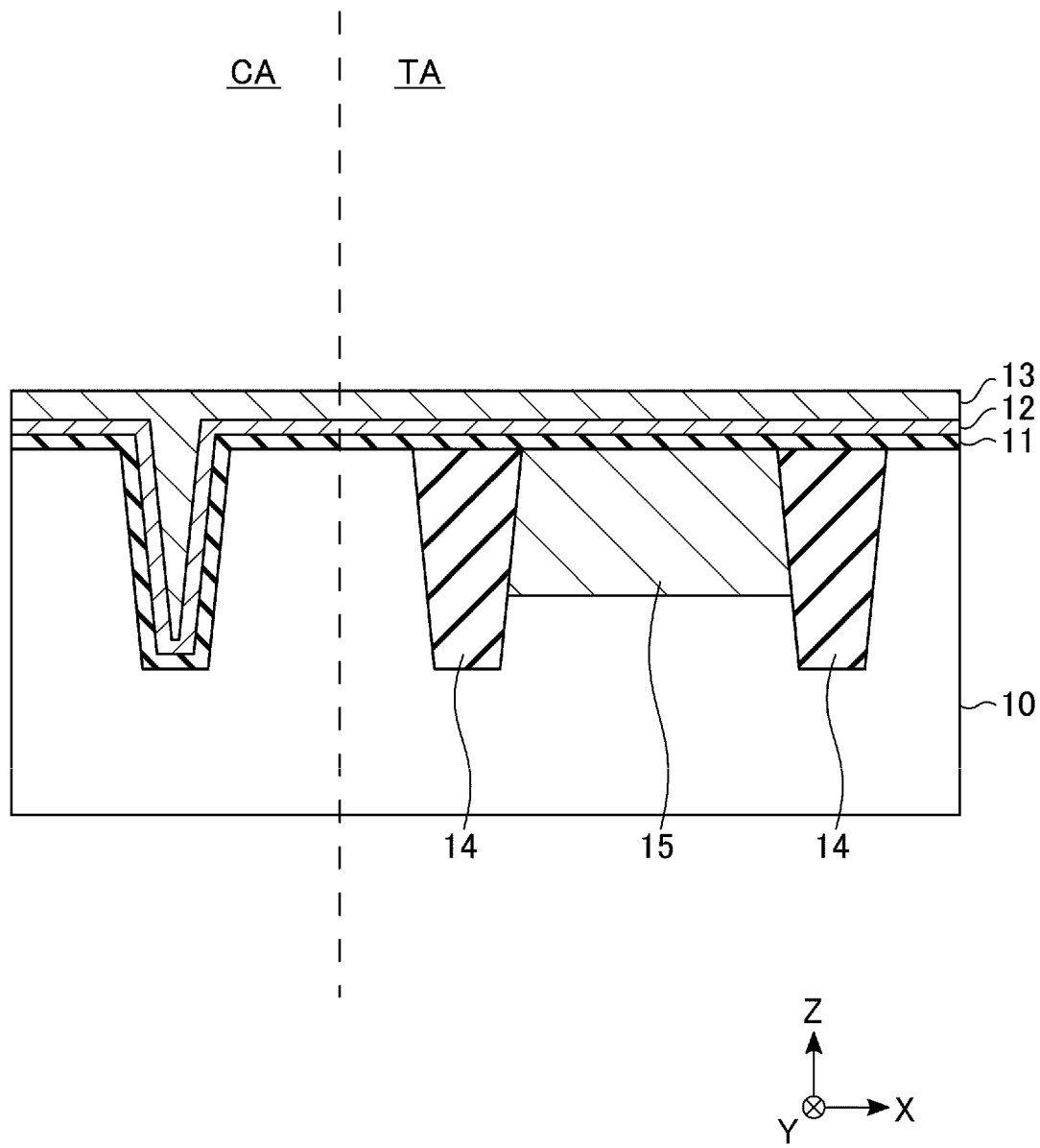
FIG. 13 is a cross-sectional view showing an example of the manufacturing process of the semiconductor device according to the first embodiment.

Next, as shown in FIG. 13, the insulator layer 11, the semiconductor layer 12, and the conductor 13 are formed (step S108). Specifically, first, the insulator layer 11 is formed on the surface of the semiconductor substrate 10, aside surface and a bottom portion of the etching portion EP, a surface of the insulator 14, and a surface of the well area 15. Subsequently, the semiconductor layer 12 is formed on a surface of the insulator layer 11. Further, the conductor 13 is formed on a surface of the semiconductor layer 12 so as to fill up the etching portion EP. The insulator layer 11 includes, for example, silicon oxide. The semiconductor layer 12 includes, for example, silicon (Si). The conductor 13 includes, for example, tungsten (W).

Next, a mask 23 is formed and processed (step S109). Specifically, the mask 23 is formed on the conductor 13 by the photolithography or the like. The mask 23 covers, for example, an area corresponding to one electrode of the capacitor CP and an area corresponding to the gate electrode of the transistor TR, and opens at other areas.

Figure 14:
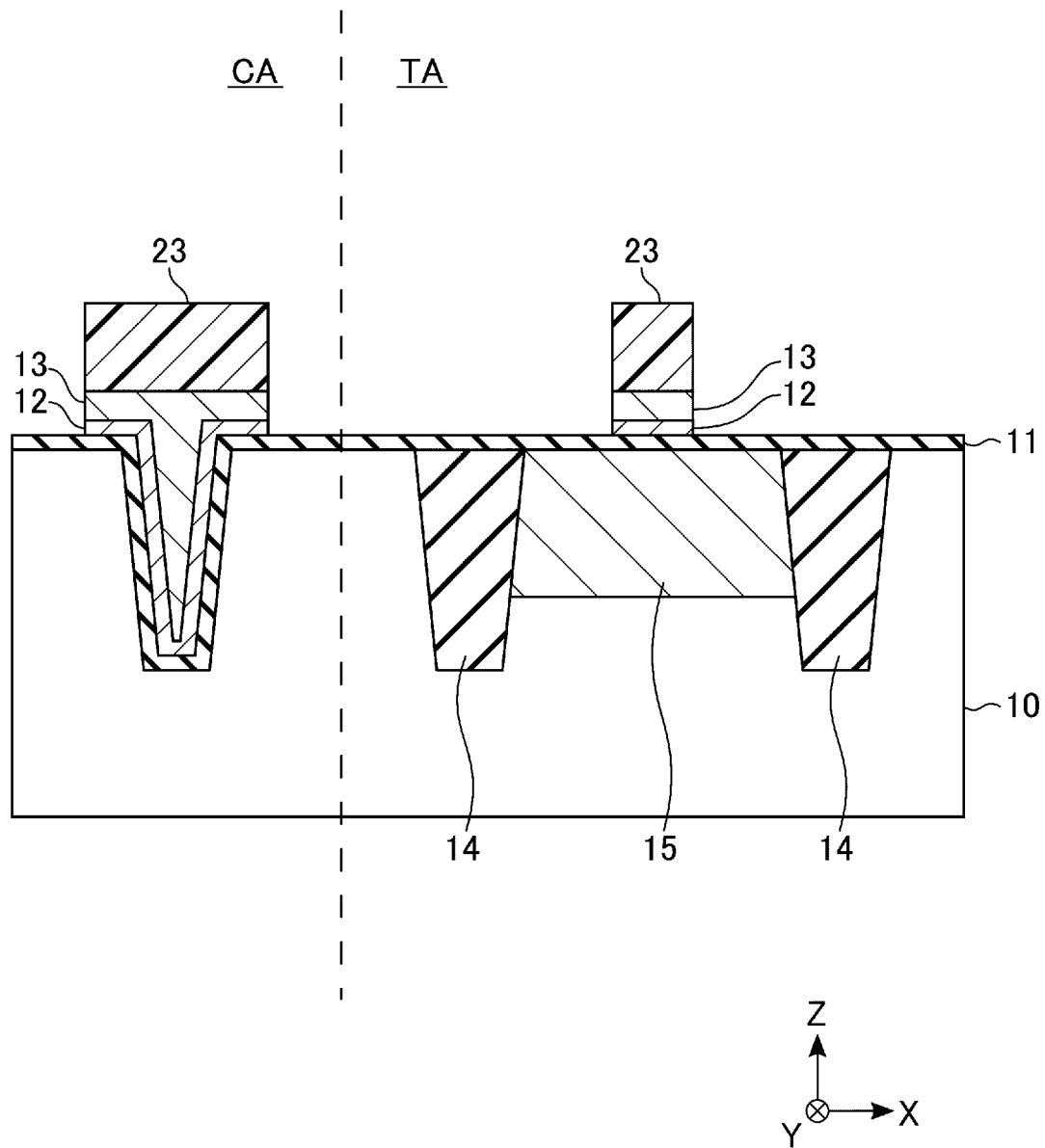
FIG. 14 is a cross-sectional view showing an example of the manufacturing process of the semiconductor device according to the first embodiment.

Next, as shown in FIG. 14, the semiconductor layer 12 and the conductor 13 are processed (step S110). Specifically, parts of the semiconductor layer 12 and the conductor 13 are removed by the anisotropic etching using the mask 23, and a part of the surface of the insulator layer 11 is exposed. Thereafter, the mask 23 is removed by, for example, wet etching (step S111).

Figure 15:
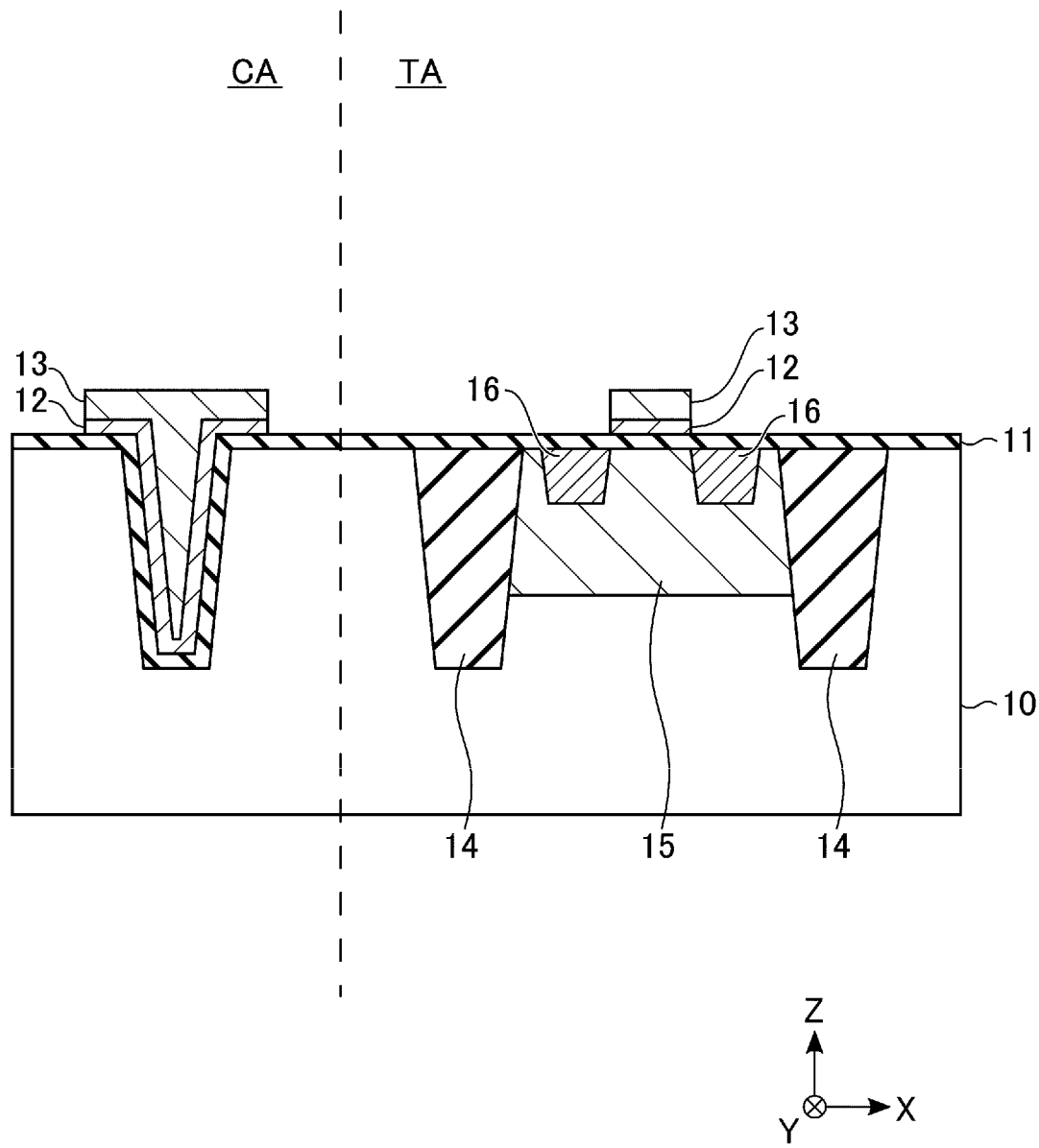
FIG. 15 is a cross-sectional view showing an example of the manufacturing process of the semiconductor device according to the first embodiment.

Next, as shown in FIG. 15, the diffusion areas 16 are formed (step S112). Specifically, for example, boron is doped in the well area 15 to form the diffusion areas 16. Thereafter, various wirings including the conductor 17 and the conductor 30 are provided above the semiconductor substrate 10. The conductor 17 and the capacitor CP are connected by the contact CT. The conductor 30 and the transistor TR are connected by the contact CT.

By the manufacturing process described above, the capacitor CP and the transistor TR are formed. The manufacturing process described above is merely an example, and other processing may be inserted during the manufacturing process.

[1-3] Effect of First Embodiment

According to the semiconductor device 1 of the first embodiment described above, manufacturing cost of the semiconductor device 1 can be reduced. A detailed effect of the semiconductor device 1 according to the first embodiment will be described below.

Current consumption of the circuit may fluctuate according to, for example, an operation of the circuit. For example, a bypass capacitor is used to reduce fluctuation in a voltage of the power supply line when the current consumption is changed. The bypass capacitor can reduce the fluctuation in the voltage of the power supply line by supplying a charged electric charge to the circuit when the current consumption of the circuit increases.

Figure 16:
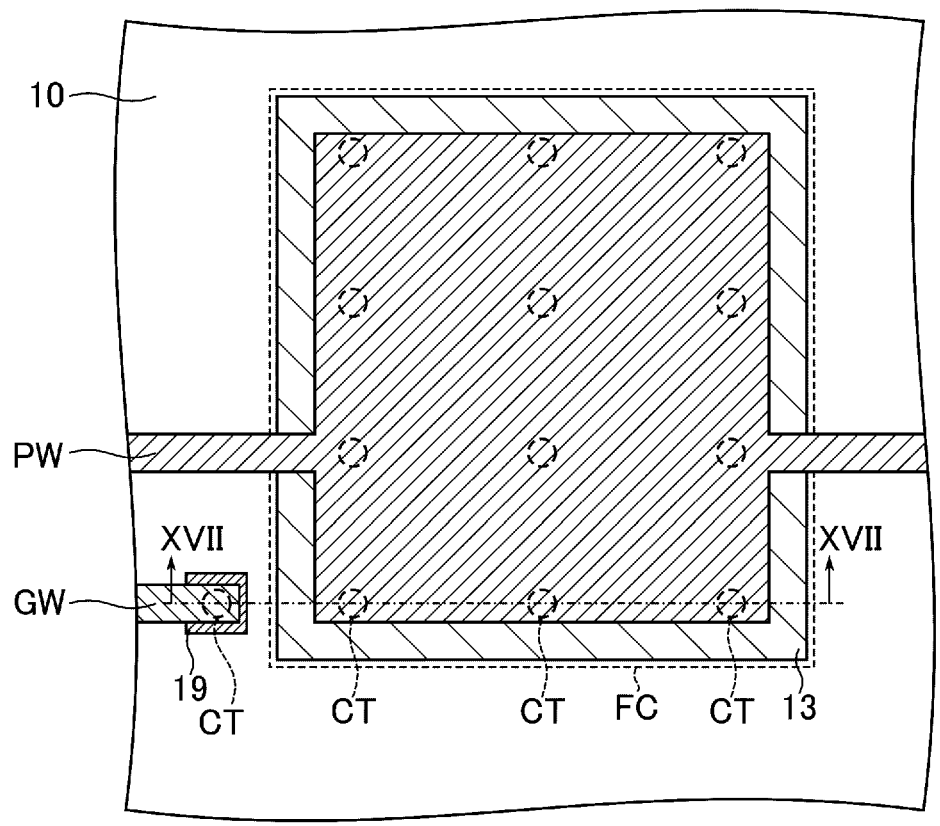
FIG. 16 is a plan view showing an example of a planar layout in a capacitor area of a semiconductor device according to a comparative example of the first embodiment.

When the bypass capacitor is provided on the semiconductor substrate, however, the bypass capacitor may require a large area in order to obtain a desired capacity. FIG. 16 shows an example of a planar layout of the capacitor unit 2 in a comparative example of the semiconductor device according to the first embodiment. FIG. 17 is a cross-sectional view corresponding to a line XVII-XVII in FIG. 16, and shows a cross-sectional structure of the capacitor unit 2 in the comparative example.

As shown in FIG. 16, the capacitor unit 2 in the comparative example includes a flat plate capacitor FC. As shown in FIG. 17, an area in which the semiconductor layer 12 and the conductor 13 are provided on the surface of the semiconductor substrate 10 functions as the flat plate capacitor FC. An occupation area of the flat plate capacitor FC on the semiconductor substrate 10 is substantially equal to a surface area of one electrode.

In contrast, the semiconductor device 1 according to the first embodiment includes a plurality of capacitors CP each having a portion provided along the concave portion CC. The surface area of one electrode is larger than an occupation area of the capacitor CP on the semiconductor substrate 10. That is, the capacitor CP in the semiconductor device 1 according to the first embodiment has a larger capacity per unit area than the flat plate capacitor FC in the comparative example with respect to the occupation area on the semiconductor substrate 10.

Thus, in the semiconductor device 1 according to the first embodiment, the occupation area of the capacitor can be reduced while maintaining the capacity of the capacitor. Therefore, the occupation area of the bypass capacitor can be reduced, so that a size of the semiconductor substrate 10 on which the semiconductor device 1 is provided can be reduced, and the manufacturing cost of the semiconductor device 1 can be reduced.

In the semiconductor device 1 according to the first embodiment, some of the processes of forming the transistor TR and the capacitor CP can be integrated. Specifically, shapes corresponding to the concave portion CC and the insulating area STI are processed collectively as the plurality of etching portions EP, as shown in step S102 of FIG. 6. The semiconductor layer 12 and the conductor 13 as one electrode of the capacitor CP are formed and processed at the same time with the semiconductor layer 12 and the conductor 13 as the gate electrode of the transistor.

Thus, in the semiconductor device 1 according to the first embodiment, an increase in the number of processes involved in the formation of the capacitor CP can be prevented. Therefore, the manufacturing cost of the semiconductor device 1 according to the first embodiment can be reduced.

[2] Second Embodiment

The second embodiment is a specific example of a layout of the capacitor CP in the semiconductor device 1 according to the first embodiment. Differences of the semiconductor device 1 according to the second embodiment from the first embodiment will be described below.

[2-1] Configuration

FIG. 18 shows an example of a circuit configuration of the semiconductor device 1 according to the second embodiment. As shown in FIG. 18, the semiconductor device 1 according to the second embodiment includes capacitor units CU1 to CU4 as the capacitor unit 2, includes circuits 3a and 3b as the circuit unit 3, and further includes a signal line SW. Resistance components of the power supply line PW are shown using resistors RP1 and RP2. The description of the pad P2 and the power supply line GW is omitted, and is indicated by a ground symbol.

A signal CLK is input to the circuit 3a. Then, the circuit 3a outputs a signal based on the signal CLK to the circuit 3b via the signal line SW. The circuits 3a and 3b are supplied with a power supply voltage from the power supply line PW. Hereinafter, connecting portions between the power supply line PW and the circuit 3a or 3b are referred to as a power supply end of the circuit 3a and a power supply end of the circuit 3b. A voltage of the power supply end of the circuit 3a is referred to as a voltage VDD1, and a current consumed by the circuit 3a is referred to as a current I1.

Each of the capacitor units CU1 to CU4 includes, for example, a plurality of capacitors CP connected in parallel. One electrode of each of the capacitor units CU1 and CU2 has a short distance from the power supply end of the circuit 3a. One electrode of each of the capacitor units CU3 and CU4 has a short distance from the power supply end of the circuit 3b. The resistance component of the power supply line PW from the pad P1 to the capacitor units CU1 and CU2 and the circuit 3a is indicated by the resistor RP1. The resistance component of the power supply line PW from the capacitor units CU1 and CU2 and the circuit 3a to the capacitor units CU3 and CU4 and the circuit 3b is indicated by the resistor RP2.

Figure 19:
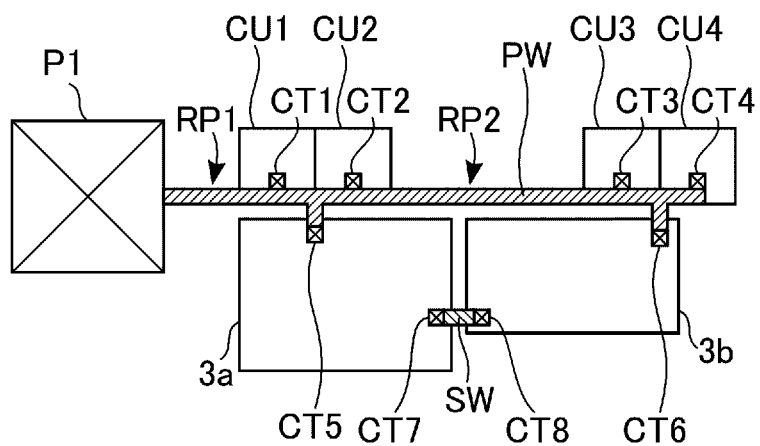
FIG. 19 is a plan view showing an example of a planar layout of the semiconductor device according to the second embodiment.

FIG. 19 shows an example of a planar layout of the semiconductor device 1 according to the second embodiment. As shown in FIG. 19, the semiconductor device 1 according to the second embodiment further includes contacts CT1 to CT8. As shown in FIG. 19, the power supply line PW extends from the pad P1 in the X direction.

The circuits 3a and 3b are disposed along the power supply line PW. The circuit 3a is disposed closer to the pad P1 than the circuit 3b. The power supply ends of the circuits 3a and 3b are connected to the power supply line PW. The circuit 3a and the circuit 3b are connected via the signal line SW. The capacitor units CU1 and CU2 are disposed close to the power supply end of the circuit 3a. The capacitor units CU3 and CU4 are disposed close to the power supply end of the circuit 3b.

The contact CT1 connects the power supply line PW and one electrode of the capacitor unit CU1. The contact CT2 connects the power supply line PW and one electrode of the capacitor unit CU2. The contact CT3 connects the power supply line PW and one electrode of the capacitor unit CU3. The contact CT4 connects the power supply line PW and one electrode of the capacitor unit CU4. The contact CT5 connects the power supply line PW and the power supply end of the circuit 3a. The contact CT6 connects the power supply line PW and the power supply end of the circuit 3b. The contact CT7 connects the signal line SW and a signal output unit of the circuit 3a. The contact CT8 connects the signal line SW and a signal input unit of the circuit 3b.

In the example shown in FIG. 19, the resistance component of the power supply line PW from the pad P1 to a portion to which the contacts CT1, CT2 and CT5 are connected corresponds to the resistor RP1. The resistance component of the power supply line PW from the portion to which the contacts CT1, CT2, and CT5 are connected to a portion to which the contacts CT3, CT4, and CT6 are connected corresponds to the resistor RP2. Other configurations of the semiconductor device 1 according to the second embodiment are similar to those of the first embodiment.

[2-2] Effect of Second Embodiment

According to the semiconductor device 1 of the second embodiment described above, operation reliability of the semiconductor device 1 can be improved. Detailed effects of the semiconductor device 1 according to the second embodiment will be described below.

In the design of a semiconductor device, it is preferable that the elements such as a plurality of circuits and a plurality of capacitors are densely laid out. When the elements are densely laid out, an increase in the size of the semiconductor substrate can be prevented, and the manufacturing cost of the semiconductor device can be reduced. The resistance component of the wiring provided between the bypass capacitor and the power supply end of the circuit is preferably small. When the resistance component of a wiring provided between the bypass capacitor and the power supply end of the circuit is small, the bypass capacitor can quickly supply an electric charge to the circuit, and it is possible to further reduce the fluctuation of the power supply voltage.

Figure 20:
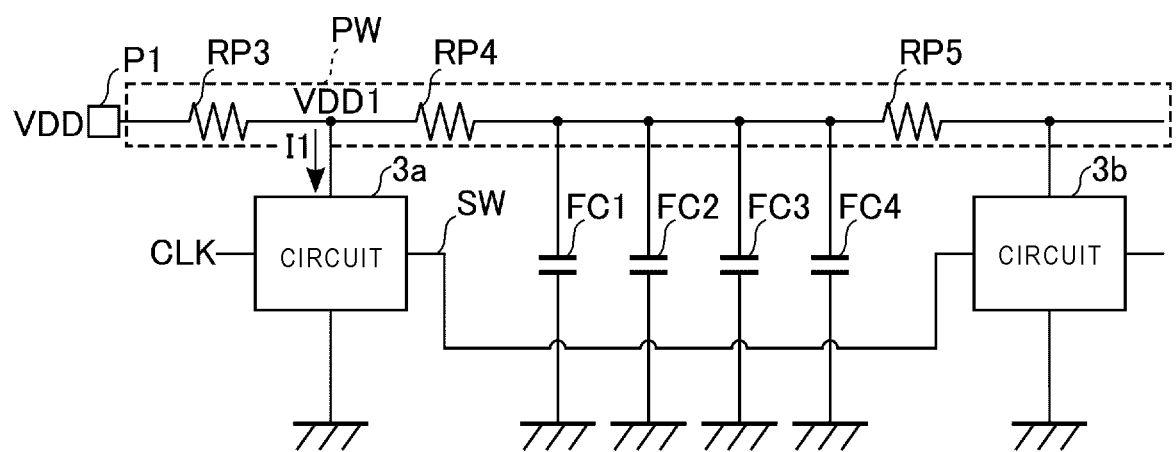
FIG. 20 is a block diagram showing a structural example of the semiconductor device according to a comparative example of the second embodiment.

However, when a size of a certain element is large, for example, when a size of the capacitor is large, if the circuit and the bypass capacitor are densely disposed, the wiring connecting the bypass capacitor and the power supply end of the circuit may become long. FIG. 20 shows an example of a circuit configuration of the semiconductor device 1 according to a comparative example of the second embodiment. As shown in FIG. 20, the semiconductor device 1 according to the comparative example is different from the second embodiment in that the semiconductor device 1 includes flat plate capacitors FC1 to FC4 as the capacitor unit 2 and that resistance components of the power supply line PW are indicated by resistors RP3 to RP5.

The flat plate capacitors FC1 to FC4 are collectively provided. The circuit 3a is provided closer to the pad P1 than the flat plate capacitors FC1 to FC4. The circuit 3b is provided farther from the pad P1 than the flat plate capacitors FC1 to FC4. The resistance component of the power supply line PW from the pad P1 to the power supply end of the circuit 3a is indicated by the resistor RP3. The resistance component of the power supply line PW from the power supply end of the circuit 3a to the flat plate capacitors FC1 to FC4 is indicated by the resistor RP4. The resistance component of the power supply line PW from the flat plate capacitors FC1 to FC4 to the power supply end of the circuit 3b is indicated by the resistor RP5.

Figure 21:
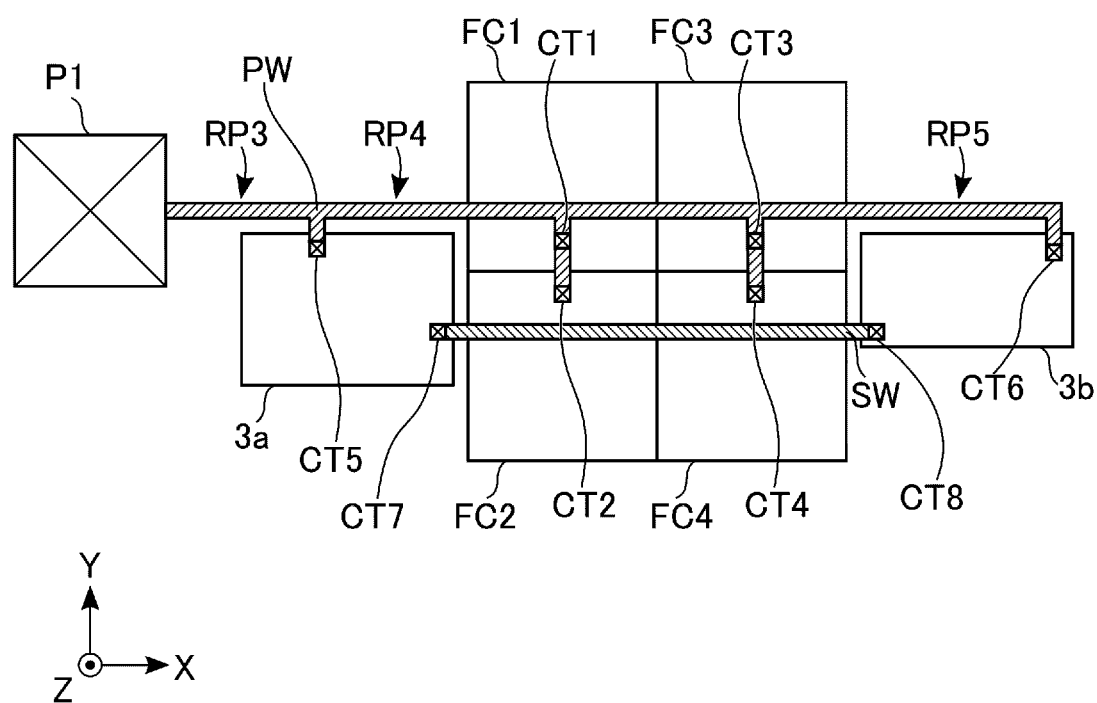
FIG. 21 is a plan view showing an example of a planar layout of the semiconductor device according to the comparative example of the second embodiment.

FIG. 21 shows an example of a planar layout of the semiconductor device 1 according to the comparative example of the second embodiment. As shown in FIG. 21, the semiconductor device 1 according to the comparative example further includes the contacts CT1 to CT8. Each of the flat plate capacitors FC1 to FC4 in the comparative example has substantially equal capacity as each of the capacitor units CU1 to CU4 in the semiconductor device 1 according to the second embodiment.

That is, the flat plate capacitor FC in the comparative example has a smaller capacity per unit area on the semiconductor substrate 10 than the capacitor unit CU in the second embodiment. Therefore, the occupation area of the flat plate capacitor FC on the semiconductor substrate 10 is larger than that of the capacitor unit CU. In order to densely dispose the large flat plate capacitor FC, the layout of the comparative example is different from the layout of the semiconductor device 1 according to the second embodiment.

Specifically, in the comparative example, the circuit 3a, the flat plate capacitors FC1 and FC2, the flat plate capacitors FC3 and FC4, and the circuit 3b are disposed along the power supply line PW in order from the pad P1. The flat plate capacitors FC1 to FC4 are disposed between the circuit 3a and the circuit 3b. The power supply line PW overlaps the flat plate capacitors FC1 and FC3. The signal line SW overlaps the flat plate capacitors FC2 and FC4. In the comparative example, the resistance component of the power supply line PW from the pad P1 to a connecting portion of the contact CT5 corresponds to the resistor RP3. The resistance component of the power supply line PW from the connecting portion of the contact CT5 to a connecting portion of the contacts CT1 to CT4 corresponds to the resistor RP4. The resistance component from the connecting portion of the contacts CT1 to CT4 to a connecting portion of the contact CT6 corresponds to the resistor RP5.

Thus, in the semiconductor device 1 according to the comparative example, the power supply line PW connecting the power supply end of the circuit 3a and the flat plate capacitors FC1 to FC4 is long and includes the resistance component corresponding to the resistor RP4. The power supply line PW connecting the circuit 3b and the flat plate capacitors FC1 to FC4 is long and includes the resistance component corresponding to the resistor RP5.

By contrast, in the semiconductor device 1 according to the second embodiment, the capacitor unit CU whose occupation area on the semiconductor substrate 10 is smaller than that of the flat plate capacitor FC is disposed close to the power supply end of the circuit. The power supply line PW of a portion connecting the power supply end of the circuit 3a and the capacitor units CU1 and CU2 is short, and the resistance component of the power supply line PW in the connected portion is small. The power supply line PW connecting the power supply end of the circuit 3b and the capacitor units CU3 and CU4 is short and the resistance component is small.

Figure 22:
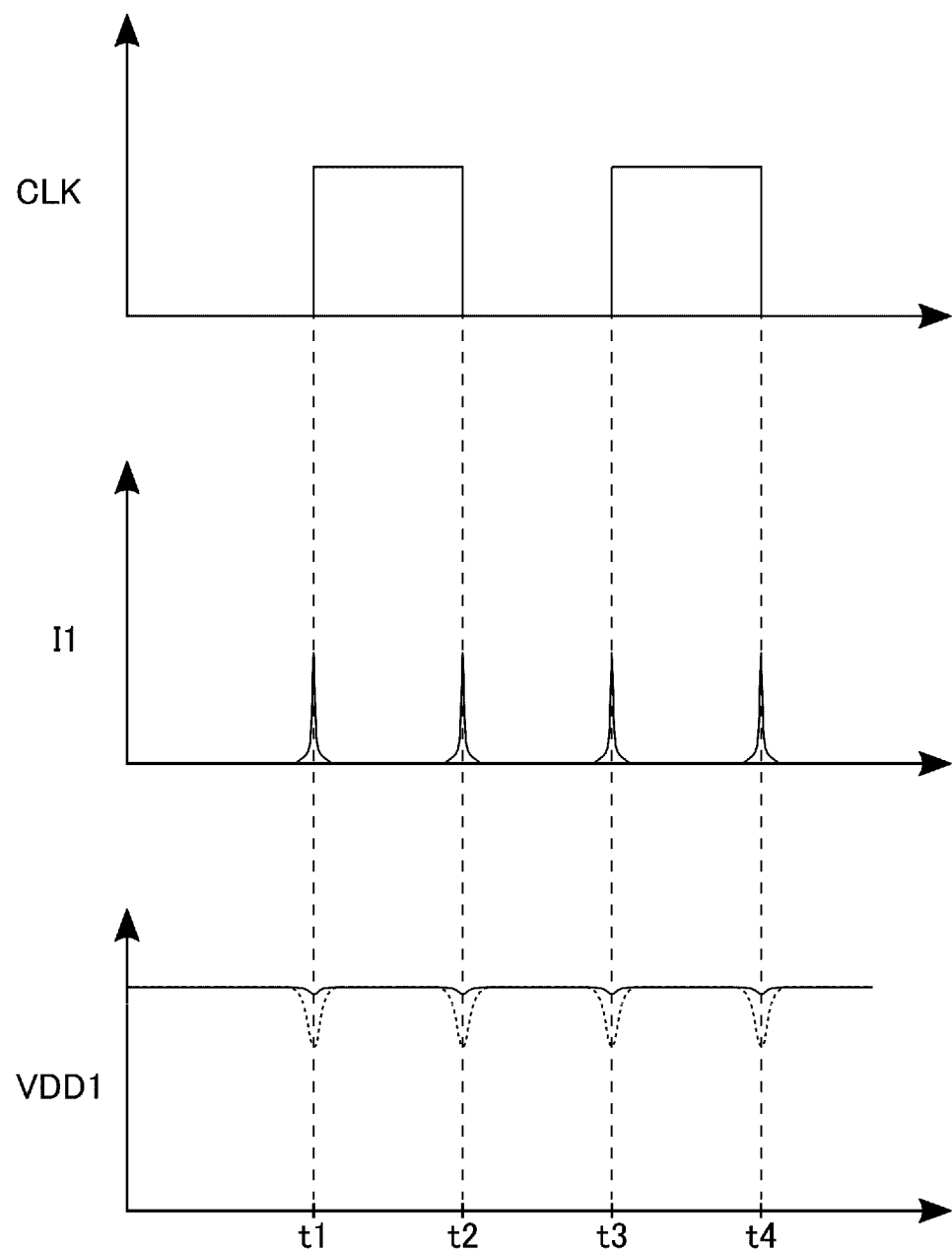
FIG. 22 is a graph showing changes in a voltage and a current with time in the semiconductor device according to the second embodiment and the comparative example of the second embodiment.

Thus, in the semiconductor device 1 according to the second embodiment, even when the circuits and the capacitors are densely disposed, the resistance component of the wiring provided between the bypass capacitor and the power supply end of the circuit can be reduced. FIG. 22 shows relationships between a voltage and a current and time in the semiconductor device according to the second embodiment and a modification thereof. The three graphs shown in FIG. 22 show a relationship between the signal CLK and the time, a relationship between the current Il and the time, and a relationship between the voltage VDD1 and the time, in order from the top. In the graph of the voltage VDD1, a solid line indicates a second embodiment, and a broken line indicates a comparative example.

The signal CLK transitions from an "H" level to an "L" level or from the "L" level to the "H" level at each time point t1, t2, t3, and t4. The circuit 3a operates based on the signal CLK, and the current Il corresponding to the current consumption of the circuit 3a increases at each of the time points t1, t2, t3, and t4. When the current Il increases, the bypass capacitor supplies an electric charge to reduce the fluctuation of the voltage VDD1. In the comparative example, since the resistance component between the circuit 3a and the bypass capacitor is large, the voltage VDD1 fluctuates in a large manner. By contrast, in the semiconductor device 1 according to the second embodiment, since the resistance component between the circuit 3a and the bypass capacitor is small, the fluctuation of the voltage VDD1 is reduced to be small. Thus, the fluctuation of the power supply voltage can be reduced in the semiconductor device 1 according to the second embodiment as compared with that in the comparative example. Therefore, the operational reliability of the semiconductor device 1 according to the second embodiment can be improved as compared with the comparative example.

In addition, the fluctuation of the power supply voltage may cause jitter. In order to operate the circuit at a high speed, it is preferable to reduce the occurrence of jitter. In regard to this, in the semiconductor device 1 according to the second embodiment, the fluctuation of the power supply voltage can be reduced as described above, and thus it is possible to reduce the occurrence of jitter.

In addition, it is preferable that a signal wiring has a small parasitic resistance and a small parasitic capacity. When the parasitic resistance and the parasitic capacity are small, the signal wiring can stably transmit a high-speed signal.

In the semiconductor device 1 according to the comparative example, the circuit 3a and the circuit 3b are provided far from each other, and are connected by a long signal line SW. When a length of the signal line SW becomes long, the parasitic resistance may increase. The signal line SW overlaps the flat plate capacitors FC2 and FC4. When the signal line SW overlaps other elements, for example, a capacitor, the parasitic capacity may increase.

By contrast, in the semiconductor device 1 according to the second embodiment, the circuit 3a and the circuit 3b are provided close to each other, and are connected by a short signal line SW. In addition, the signal line SW does not overlap other elements other than the circuit 3a and the circuit 3b.

Thus, in the semiconductor device 1 according to the second embodiment, since the parasitic resistance and the parasitic capacity of the signal line SW are small, high-speed signals can be stably transmitted, and the operation reliability of the semiconductor device 1 can be improved.

[3] Third Embodiment

The third embodiment is a modification of the layout and a capacity design of the capacitor CP in the semiconductor device 1 according to the second embodiment. Differences of the semiconductor device 1 according to the third embodiment from the second embodiment will be described below.

[3-1] Configuration

FIG. 23 shows an example of a circuit configuration of the semiconductor device 1 according to the third embodiment. As shown in FIG. 23, the semiconductor device 1 according to the third embodiment includes capacitor sets CS1 to CS3 as the capacitor unit 2, and includes a circuit 3c as the circuit unit 3. The power supply line PW includes nodes N1 to N3. Resistance components of the power supply line PW are shown using resistors RP6 to RP8.

The power supply line PW is provided from the pad P1 to a power supply end of the circuit 3c. A distance to the power supply end of the circuit 3c becomes longer in an order of the node N1, the node N2, and the node N3. The resistance component of the power supply line PW from the pad P1 to the node N3 is indicated by the resistor RP6. The resistance component of the power supply line PW from the node N3 to the node N2 is indicated by the resistor RP7. The resistance component of the power supply line PW from the node N2 to the node N1 is indicated by the resistor RP8.

Each of the capacitor sets CS1 to CS3 includes a plurality of capacitors CP. Each of the capacitor sets CS1 to CS3 has a different capacity. A capacity of the capacitor set CS2 is larger than a capacity of the capacitor set CS1. A capacity of the capacitor set CS3 is larger than the capacity of the capacitor set CS2. For example, the capacity of the capacitor set CS2 is ten times the capacity of the capacitor set CS1, and the capacity of the capacitor set CS3 is ten times the capacity of the capacitor set CS2. For example, the capacities of the capacitor sets CS1 to CS3 are determined by the number of capacitors CP in each of the capacitor sets. The capacitor sets CS1 to CS3 are provided between the power supply line PW and the ground node. Specifically, one electrode in each of the capacitor sets CS1 to CS3 is connected to each of the nodes N1 to N3.

FIG. 24 shows an example of a planar layout of the semiconductor device 1 according to the third embodiment. As shown in FIG. 24, the semiconductor device 1 according to the third embodiment further includes contacts CT10 to CT13. Each of the capacitor sets CS1 to CS3 includes a plurality of capacitors CP. The number of capacitors CP in the capacitor set increases in order of the capacitor set CS1, the capacitor set CS2, and the capacitor set CS3. In the example shown in FIG. 24, the number of capacitors CP is shown in a simplified manner.

The power supply line PW extends from the pad P1 in the X direction. The capacitor set CS3, the capacitor set CS2, the capacitor set CS1, and the circuit 3c are disposed in this order from a side closer to the pad P1 along the power supply line PW.

The contact CT10 connects the power supply line PW and the power supply end of the circuit 3c. The contact CT11 connects the power supply line PW and one electrode of the capacitor CP in the capacitor set CS1. Each of a plurality of contacts CT12 connects the power supply line PW and one electrode of the capacitor CP in the capacitor set CS2. Each of the contacts CT13 connects the power supply line PW and one electrode of the capacitor CP in the capacitor set CS3.

In the example shown in FIG. 24, the resistance component of the power supply line PW from the pad P1 to a portion to which a plurality of contacts CT13 are connected corresponds to the resistor RP6. The resistance component of the power supply line PW from the portion to which the plurality of contacts CT13 are connected to a portion to which the plurality of contacts CT12 are connected corresponds to the resistor RP7. The resistance component of the power supply line PW from the portion to which the plurality of contacts CT12 are connected to a portion to which the contact CT11 is connected corresponds to the resistor RP8. Other configurations of the semiconductor device 1 according to the third embodiment are similar to those of the second embodiment.

[3-2] Effect of Third Embodiment

According to the semiconductor device 1 of the third embodiment described above, the operation reliability of the semiconductor device 1 can be improved. A detailed effect of the semiconductor device 1 according to the third embodiment will be described below.

The power supply voltage can fluctuate over a wide band from a low frequency to a high frequency. It is preferable that the bypass capacitor can reduce the fluctuation of the power supply voltage in a wide band from the low frequency to the high frequency. In order to reduce the fluctuation of the power supply voltage in a low frequency band, a capacity of the bypass capacitor is preferably large. On the other hand, the fluctuation of the power supply voltage in a high frequency band can be reduced even with a bypass capacitor having a capacity smaller than that in the case of the low frequency band. When an area cannot be allocated in a periphery of the circuit, it is conceivable to provide a bypass capacitor at a position far from the circuit, but the power supply line connecting the circuit and the bypass capacitor may be long. When the power supply line connecting the circuit and the bypass capacitor becomes long, a resistance value of the wiring may be increased. A capability of reducing a voltage fluctuation in the high frequency band of the bypass capacitor may be limited as a length of the power supply line connecting the bypass capacitor and the circuit increases.

By contrast, the semiconductor device 1 according to the third embodiment includes the capacitor sets CS1 to CS3 having different capacities. The capacities of the capacitor sets CS1 to CS3 are designed to be smaller as it becomes closer to the circuit, and are designed to be larger as it becomes farther from the circuit.

For example, the capacitor set CS1 is provided close to the power supply end of the circuit 3c with a small capacity. Since the capacitor set CS1 is connected to the circuit 3c via the power supply line PW having a short distance, the capacitor set CS1 has an excellent ability to reduce the voltage fluctuation even in the high frequency band. Since the capacity of the capacitor set CS1 is small, the occupation area by the capacitor set CS1 is small, and a layout in a periphery of the circuit 3c is not hindered. The capacitor set CS1 mainly reduces the fluctuation of the power supply voltage in the high frequency band.

The capacitor set CS2 is provided with a capacity larger than CS1 at a location where the power supply line PW extends from the power supply end of the circuit 3c until a resistance value becomes equivalent to the resistor RP8. The capacitor set CS2 has a large capacity and thus has a large occupation area, but since the capacitor set CS2 is far from the circuit 3c, it does not hinder a layout of other circuits. Since the capacitor set CS2 has a large capacity, it can be expected to have an effect for up to a frequency band lower than that of the capacitor set CS1. Since the capacitor set CS2 is connected to the circuit 3c via the power supply line PW having a medium distance, a capability to reduce the voltage fluctuation in the high frequency band may be moderately limited. When an influence of a magnitude of the capacity and a wiring length is combined, the capacitor set CS2 reduces the fluctuation of the power supply voltage in a frequency band lower than that of the capacitor set CS1.

The capacitor set CS3 is provided with a capacity further larger than CS2 at a location where the power supply line PW extends from the power supply end of the circuit 3c until a resistance value becomes equivalent to a sum of RP7 and RP8. The capacitor set CS3 has a further larger capacity and thus has a further larger occupation area, but since the capacitor set CS3 is farther from the circuit 3c, it does not hinder the layout of other circuits. Since the capacitor set CS3 has a even larger capacity, it can be expected to have an effect for up to a frequency band even lower than that of the capacitor set CS2. Since the capacitor set CS3 is connected to the circuit 3c via the power supply line PW having a long distance, a capability to reduce the voltage fluctuation in the high frequency band may be largely limited. When the influence of the capacity and the wiring length is combined, the capacitor set CS3 reduces the fluctuation of the power supply voltage in a frequency band further lower than that of the capacitor set CS2.

As described above, in the semiconductor device 1 according to the third embodiment, the fluctuation of the power supply voltage can be reduced in a wide frequency band without concentrating the capacitors in the periphery of the circuit. Further, in the semiconductor device 1 according to the third embodiment, it is possible to prevent an increase in the area occupied by the capacitors in the periphery of the circuit by using the capacitor CP having a portion along the concave portion CC.

[4] Other Modifications

Figure 25:
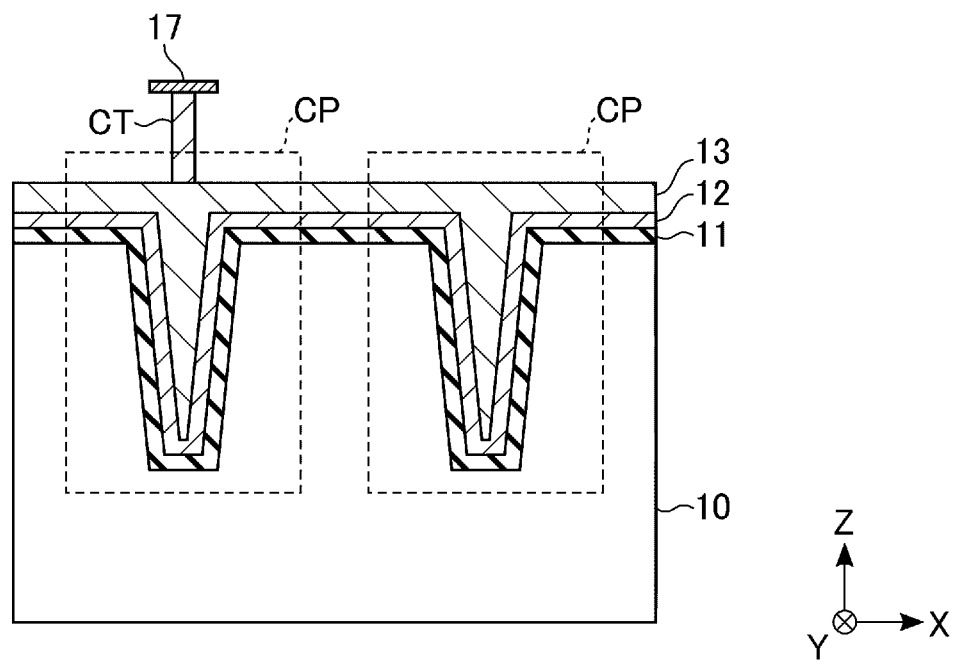
FIG. 25 is a cross-sectional view showing an example of a cross-sectional structure of a capacitor area according to a first modification of the first to third embodiments.

In the first embodiment, the case where the semiconductor layers 12 and the conductors 13 are separated between the adjacent concave portions CC in the capacitor area CA is described as an example, but the structure of the capacitor area CA is not limited thereto. For example, the semiconductor layers 12 and the conductors 13 may not be separated in the capacitor area CA. FIG. 25 shows an example of a cross-sectional structure in the capacitor area CA in a modification. As shown in FIG. 25, in the capacitor area CA, the plurality of capacitors CP may be connected in parallel by continuously providing the semiconductor layer 12 and the conductor 13. In the example shown in FIG. 25, one electrode of the capacitor CP is connected to the conductor 17 via one contact CT, but may be connected via a plurality of contacts CT.

In the first embodiment, an example is described of a series of manufacturing processes until the capacitor CP and the transistor TR are formed, but the manufacturing process is not limited thereto. For example, the insulator layer may have a multilayer structure. For example, the insulator layer 21 may have a multilayer structure of silicon oxide and silicon nitride. For example, a barrier metal may be provided between the semiconductor layer 12 and the conductor 13. For example, titanium nitride TiN may be provided between polysilicon and tungsten. In addition, tungsten nitride may be provided between the polysilicon and the tungsten.

Figure 26:
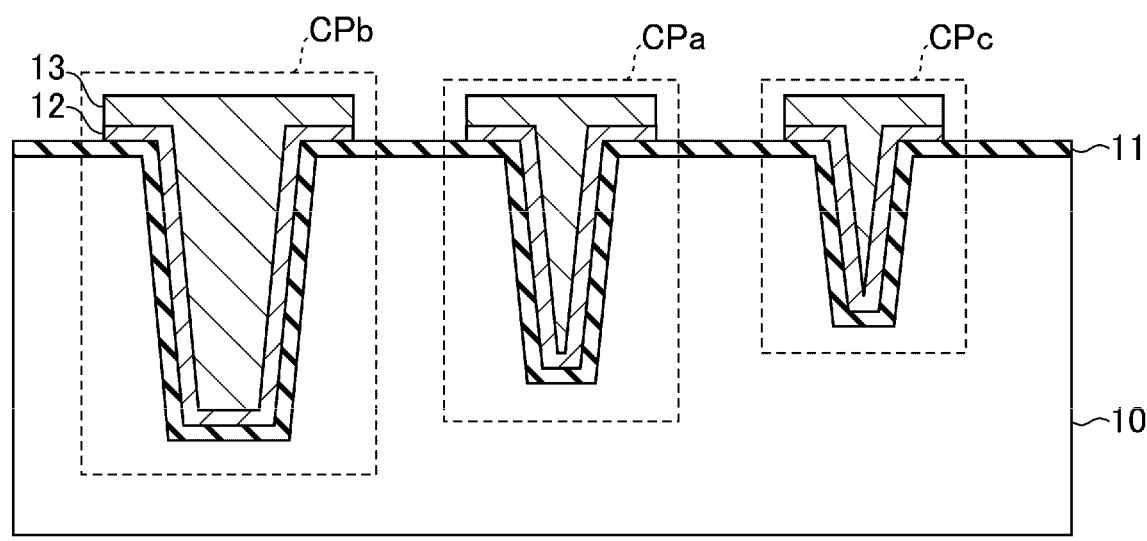
FIG. 26 is a cross-sectional view showing an example of a cross-sectional structure of a capacitor area according to a second modification of the first to third embodiments.

In the first embodiment, one type of a shape of the capacitor CP is shown, but the shape of the capacitor CP is not limited to the example. FIG. 26 shows an example of a cross-sectional structure of capacitors CPa to CPc in the modification. As shown in FIG. 26, shapes of the concave portions CC of the capacitors CPa to CPc are different from each other. The capacitor CPa is similar to the capacitor CP described in the first embodiment. The capacitor CPb is provided in a concave portion CC that is wider and deeper than the capacitor CPa. The capacitor CPc is provided in a concave portion CC that is narrower and shallower than the capacitor CPa. That is, a cross-sectional area of the concave portion is changed by changing a width and a depth of the concave portion. Thus, capacitors having different cross-sectional shapes may be separately formed by, for example, separately forming the concave portions CC. That is, by separately forming the concave portions CC having different cross-sectional areas, capacitors having different capacities may be separately formed.

In the third embodiment, the case where the magnitude of the capacity is implemented by the number of capacitors CP in the capacitor set CS is described as an example, but the present disclosure is not limited thereto. For example, as described with reference to FIG. 26, the capacitor sets having different capacities may be formed by using the capacitors having different cross-sectional shapes. For example, the capacitor set CS1 having a small capacity may be formed by using the capacitor CPc having a narrow width and a shallow depth, the capacitor set CS2 may be formed using the capacitor CPa, and the capacitor set CS3 having a large capacity may be formed using the capacitor CPb having a wide width and a deep depth.

Although the capacitor CP is formed in the concave portion CC as illustrated in the first to third embodiments, a shape of the portion where the capacitor CP is formed is not limited to the concave portion. For example, the capacitor CP may be formed in a slit formed in the semiconductor substrate 10. In this case, the semiconductor layer 12 in the capacitor CP has a portion extending in a direction parallel to the surface of the semiconductor substrate 10.

In the third embodiment, the number of capacitors CP in each of the capacitor sets CS1 to CS3 is illustrated with reference to FIG. 24, but the number of capacitors CP in each of the capacitor sets CS1 to CS3 is not limited thereto. In addition, a ratio of the capacity of each of the capacitor sets CS1 to CS3 is not limited to the example described with reference to FIG. 24. For example, as an example of a layout suitable for a circuit that operates at high speed, the ratio of the capacity of each of the capacitor sets CS1 to CS3 may be 1:10:1000. A magnitude of the capacitor set CS3 may be changed, for example, in a range of 10 to 1000 times the capacitor set CS2. For example, the capacity of the capacitor set CS2 may be one digit larger than that of the capacitor set CS1, and the capacity of the capacitor set CS3 may be one to three digits larger than that of the capacitor set CS2.

Figure 27:
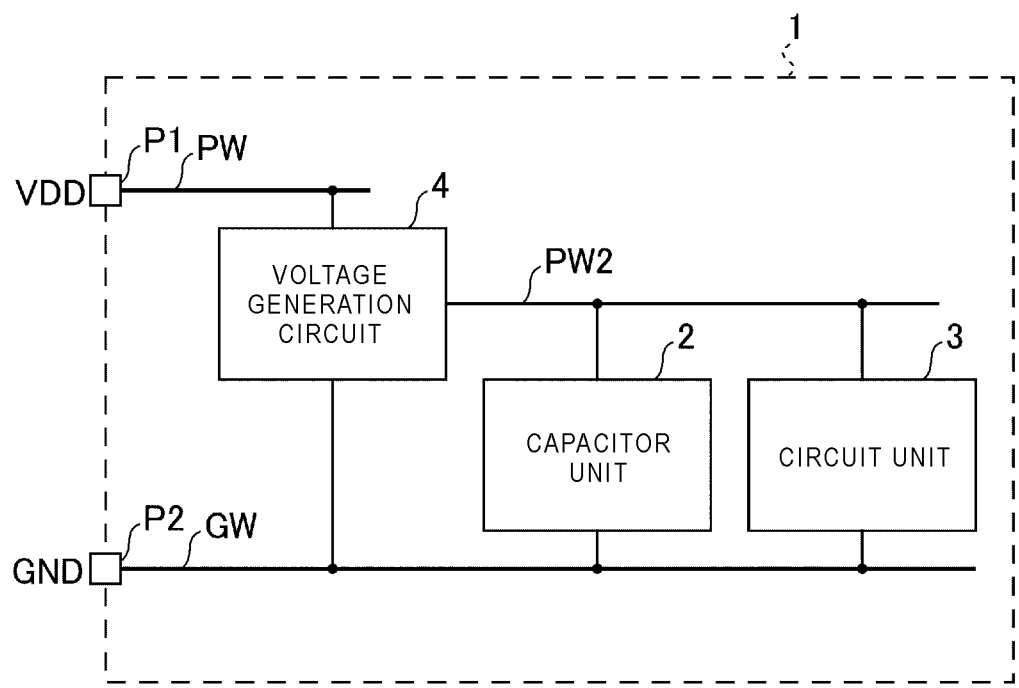
FIG. 27 is a block diagram showing a configuration example of the semiconductor device according to a third modification of the first to third embodiments.

In the first to third embodiments, the power supply line PW is connected to the pad P1, and the capacitor unit 2 is connected to the power supply line PW. A wiring to which the capacitor unit 2 is connected is not limited to the power supply line PW connected to the pad P1. FIG. 27 shows a structural example of the semiconductor device 1 according to a modification. As shown in FIG. 27, the semiconductor device according to the modification is different from the semiconductor device 1 according to the first embodiment in that the semiconductor device 1 according to the modification further includes a voltage generation circuit 4 and a power supply line PW2, and that the capacitor unit 2 and the circuit unit 3 are connected between the power supply line PW2 and the power supply line GW. Thus, the capacitor unit 2 may be connected to, for example, a wiring to which a voltage generated inside the semiconductor device is applied.

Although the power supply line PW and the capacitor CP are connected to each other via one contact CT in the first to third embodiments, a plurality of contacts may be connected between the power supply line PW and the capacitor CP, or different wirings may be interposed therebetween.

In the third embodiment, regarding the capacitor set, a case in which the plurality of capacitors CP are connected to the power supply line PW via the contacts CT is described as an example. The configuration of the capacitor set is not limited to the example described in the third embodiment. For example, one electrode of each of a plurality of capacitors CP collectively provided in a certain area is commonly connected to form a capacitor set. When a plurality of capacitor sets are provided on the semiconductor substrate, each of the plurality of capacitor sets can be distinguished as an independent capacitor based on the magnitude of the capacity of each capacitor set, and a connection location between each capacitor set and the power supply line PW.

The shape referred to as the concave portion CC in the present specification can be rephrased in a number of ways. For example, the semiconductor substrate 10 having the concave portion CC can be rephrased as a semiconductor substrate 10 having a first surface, a second surface facing the first surface, and a third surface provided between the first surface and the second surface. The first surface is, for example, the surface of the semiconductor substrate 10. The second surface is, for example, a back surface of the semiconductor substrate 10. The third surface is, for example, the bottom portion of the concave portion CC. The semiconductor layer 12 provided along the concave portion CC can be rephrased as the semiconductor layer 12 provided along the first surface from the third surface. For example, a fourth surface is provided between the first surface and the second surface, and a capacitor having a semiconductor layer provided along the first surface from the fourth surface may have a capacity different from that of a capacitor having the semiconductor layer provided along the first surface from the third surface. Thus, by providing a plurality of surfaces such as the third surface and the fourth surface between the first surface and the second surface, capacitors having different capacities may be formed separately. That is, by providing a plurality of surfaces such as the third surface and the fourth surface, the concave portions CC having different cross-sectional areas may be formed separately.

The term "connection" in the present specification refers to electrical connection, and does not exclude, for example, connection via another element. The term "electrically connected" may be connection via an insulator as long as an operation can be executed similarly to those electrically connected.

[5] Fourth Embodiment

The semiconductor device according to the fourth embodiment is a specific example of the semiconductor device 1 according to the third embodiment including a plurality of circuits. The semiconductor device 1 according to the fourth embodiment will be described below regarding the differences from the first to third embodiments.

[5-1] Configuration

Figure 28:
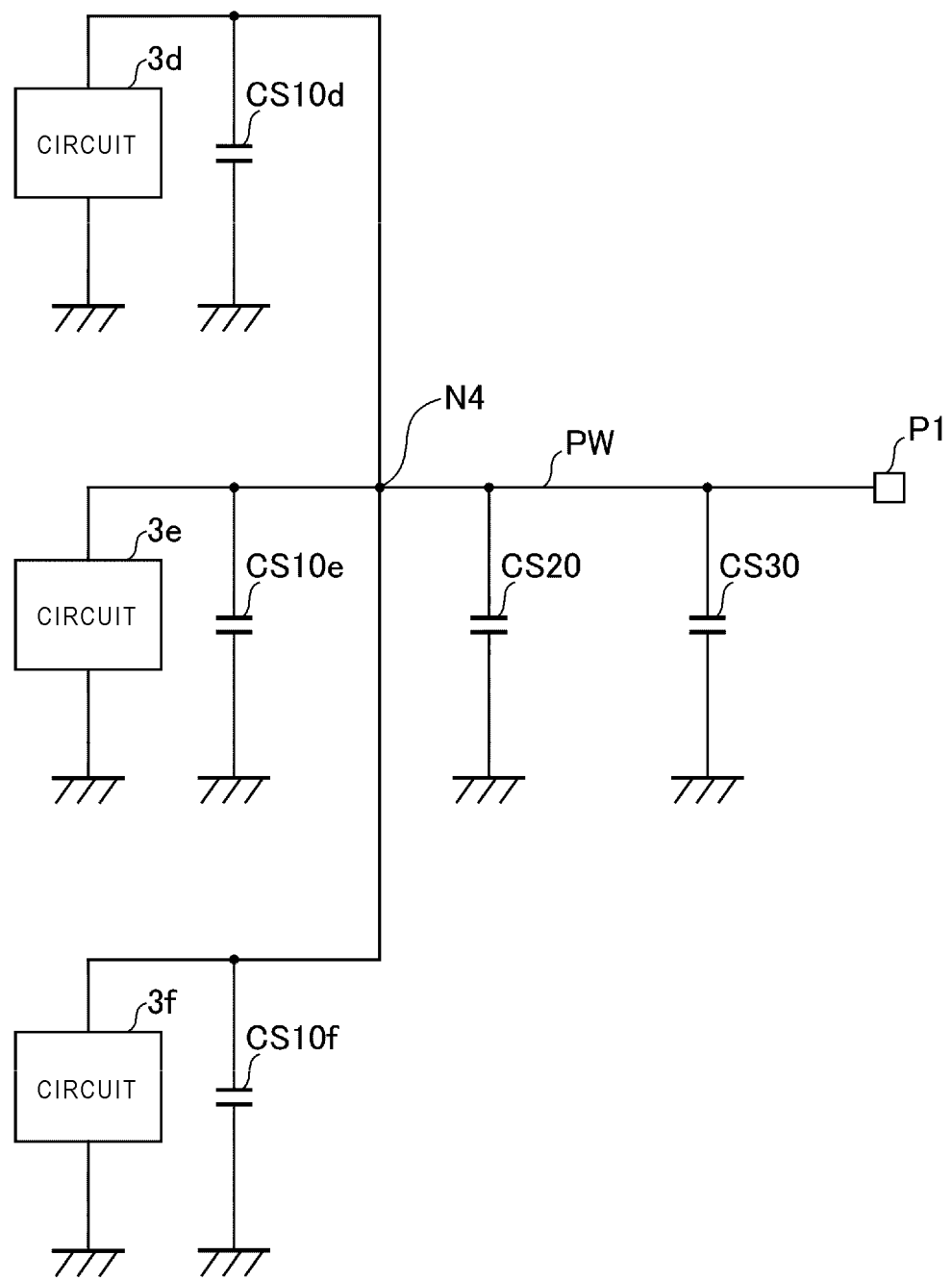
FIG. 28 is a block diagram showing a structural example of a semiconductor device according to a fourth embodiment.

FIG. 28 shows an example of a circuit configuration of the semiconductor device 1 according to the fourth embodiment. As shown in FIG. 28, the semiconductor device 1 according to the fourth embodiment includes capacitor sets CS10d, CS10e, CS10f, CS20, and CS30 as the capacitor unit 2, and includes circuits 3d, 3e, and 3f as the circuit unit 3. The power supply line PW includes a node N4.

The power supply line PW is provided from the pad P1 to power supply ends of the circuits 3d, 3e, and 3f. Specifically, a portion of the power supply line PW corresponding to a portion from the pad P1 to the node N4 are shared by the circuits 3d, 3e, and 3f. On the other hand, portions of the power supply line PW corresponding to portions from the node N4 to the respective power supply ends of the circuits 3d, 3e, and 3f are independently provided at the circuits 3d, 3e, and 3f.

One electrode of each of the capacitor sets CS10d, CS10e, CS10f, CS20, and CS30 is connected to the power supply line PW, and the other electrode thereof is grounded. One electrode of the capacitor set CS10d is connected between the power supply end of the circuit 3d and the node N4. One electrode of the capacitor set CS10e is connected between the power supply end of the circuit 3e and the node N4. One electrode of the capacitor set CS10f is connected between the power supply end of the circuit 3f and the node N4. One electrode of each of the capacitor sets CS20 and CS30 is connected between the node N4 and the pad P1 in order from the node N4 toward the pad P1.

The capacities of the capacitor sets CS10d, CS10e, and CS10f are substantially equal, for example. A capacity of the capacitor set CS20 is larger than the capacity of any of the capacitor sets CS10d, CS10e, and CS10f. The capacity of the capacitor set CS20 is, for example, ten times the capacity of the capacitor set CS10d. A capacity of the capacitor set CS30 is larger than the capacity of the capacitor set CS20. The capacity of the capacitor set CS30 is, for example, ten times the capacity of the capacitor set CS20.

That is, the capacitor sets CS10d, CS20, and CS30 are disposed in ascending order of the capacity from the circuit 3d toward the pad P1. The capacitor sets CS10e, CS20, and CS30 are disposed in ascending order of the capacity from the circuit 3e toward the pad P1. The capacitor sets CS10f, CS20, and CS30 are disposed in ascending order of the capacity from the circuit 3f toward the pad P1.

Figure 29:
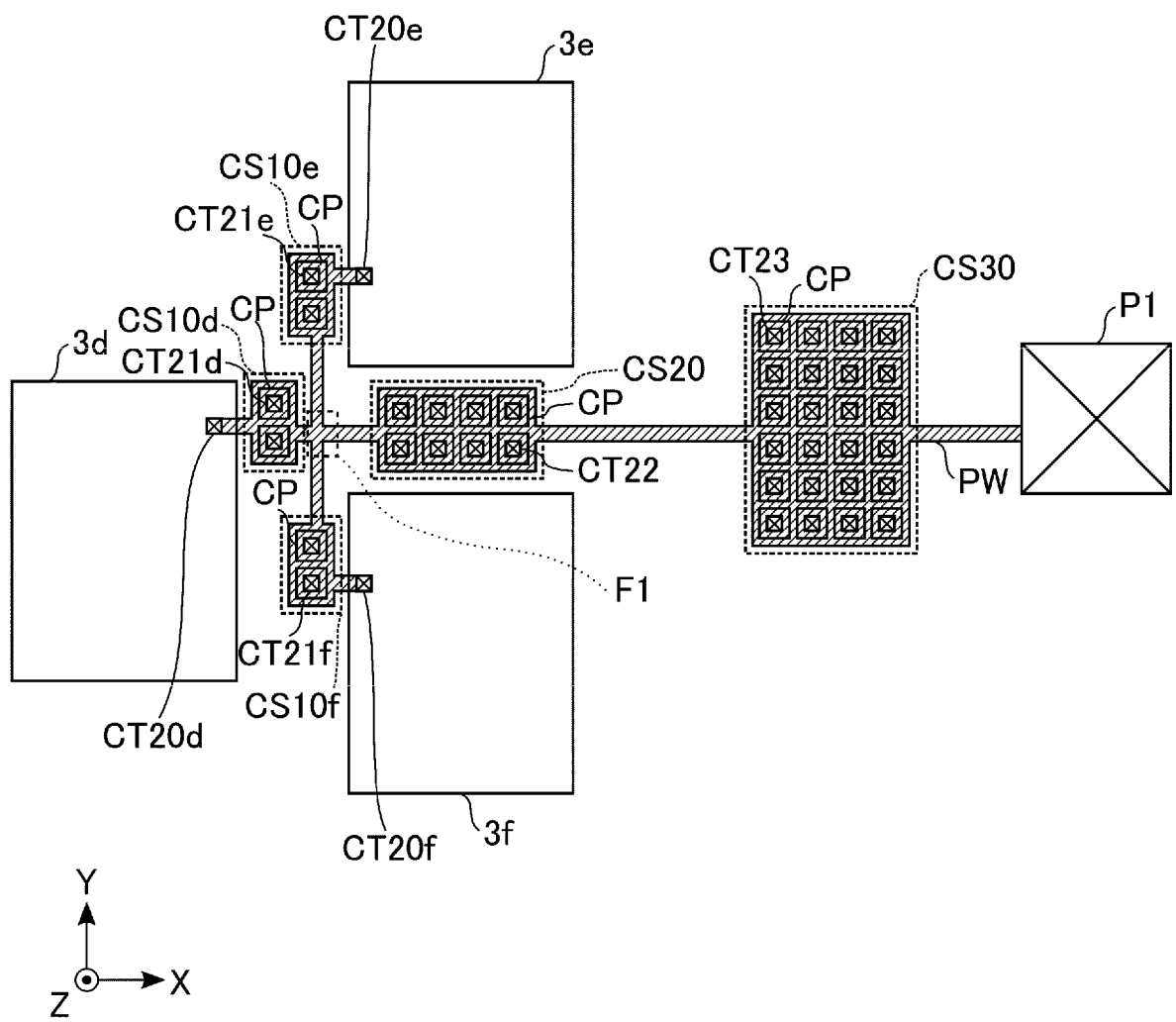
FIG. 29 is a plan view showing an example of a planar layout of the semiconductor device according to the fourth embodiment.

FIG. 29 shows an example of a planar layout of the semiconductor device 1 according to the fourth embodiment. As shown in FIG. 29, the semiconductor device 1 according to the fourth embodiment further includes contacts CT20d, CT20e, CT20f, CT21d, CT21e, CT21f, CT22, and CT23. Each of the capacitor sets CS10d, CS10e, CS10f, CS20, and CS30 includes a plurality of capacitors CP. The number of capacitors CP in the capacitor set increases, for example, in order of the capacitor set CS10d, the capacitor set CS20, and the capacitor set CS30. In the example shown in FIG. 29, the number of capacitors CP is shown in a simplified manner.

The power supply line PW extends from the pad P1 in the X direction. The capacitor set CS30, the capacitor set CS20, the capacitor set CS10d, and the circuit 3d are disposed in order from a side closer to the pad P1 along the power supply line PW. The circuit 3e is aligned with the capacitor set CS20 in the Y direction. The circuit 3f is aligned with the capacitor set CS20 in the Y direction and is disposed on an opposite side of the circuit 3e. The capacitor set CS10e is aligned with the circuit 3e in the X direction, and is disposed between the capacitor set CS10d and the capacitor set CS20 in the Y direction. The capacitor set CS10f is aligned with the circuit 3f in the X direction, and is disposed between the capacitor set CS10d and the capacitor set CS20 in the Y direction. The power supply line PW has a branch portion F1 between the capacitor set CS10d and the capacitor set CS20, and extends in the Y direction from the branch portion F1. The branch portion F1 corresponds to the node N4.

Each of the contacts CT20d, CT20e, and CT20f connects the power supply line PW and respective power supply ends of the circuits 3d, 3e, and 3f. Each of the contacts CT21d, CT21e, CT21f, CT22, and CT23 connects the power supply line PW and one electrode of respective capacitor sets CS10d, CS10e, CS10f, CS20, and CS30. Other configurations of the semiconductor device 1 according to the fourth embodiment are similar to those of the third embodiment.

[5-2] Effect of Fourth Embodiment

As described above, in the semiconductor device 1 according to the fourth embodiment, the power supply line PW with respect to the plurality of circuits has a portion shared among the plurality of circuits, and a portion independently provided corresponding to each of the plurality of circuits. Similarly to the third embodiment, in the power supply line PW connected to each of the circuits 3d, 3e, and 3f, a capacitor set having a smaller capacity is connected closer to the circuit, and a capacitor set having a larger capacity is connected farther from the circuit. In the semiconductor device 1 according to the fourth embodiment, by disposing the capacitor sets in this way, even when there are a plurality of circuits, it is possible to prevent the fluctuation of the power supply voltage similar to that in the third embodiment.

[5-3] Modifications of Fourth Embodiment

The semiconductor device 1 according to the fourth embodiment may be modified in various ways. Hereinafter, first to fifth modifications of the fourth embodiment will be described in order.

[5-3-1] First Modification

Figure 30:
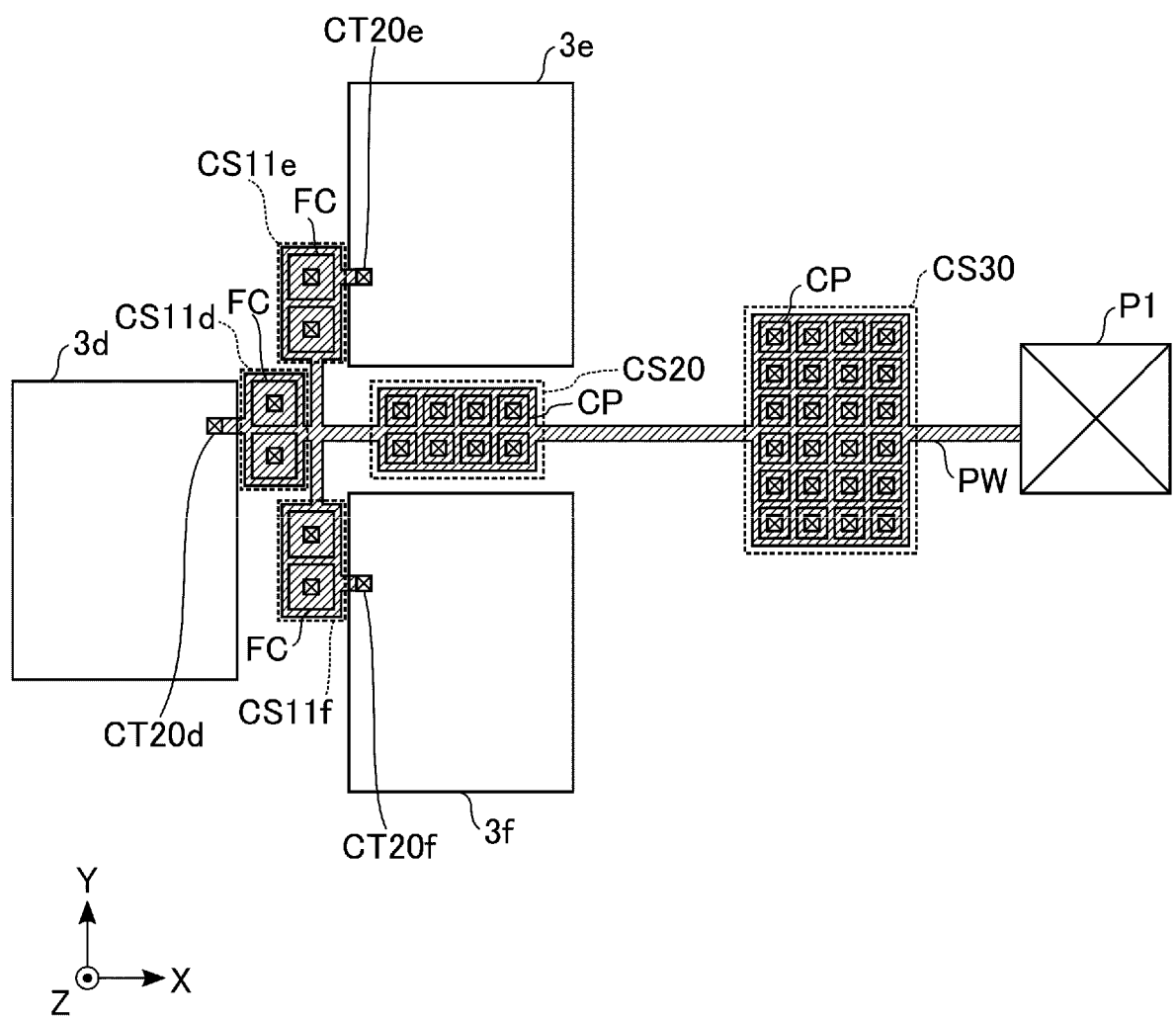
FIG. 30 is a plan view showing an example of a planar layout of the semiconductor device according to a first modification of the fourth embodiment.

FIG. 30 shows an example of a planar layout of the semiconductor device 1 according to a first modification of the fourth embodiment. As shown in FIG. 30, the semiconductor device 1 according to the first modification has a configuration in which the capacitor sets CS10d, CS10e, and CS10f in the semiconductor device 1 according to the fourth embodiment is replaced with capacitor sets CS11d, CS11e, and CS11f.

Each of the capacitor sets CS11d, CS11e, and CS11f includes a flat plate capacitor FC. That is, in the semiconductor device 1 according to the first modification, a capacitor set having a small capacity among a plurality of capacitor sets having different capacities is formed by the flat plate capacitor FC. Similar to the fourth embodiment, the plurality of capacitor sets CS are provided with those having a small capacity close to the circuit and those having a large capacity far from the circuit. Other configurations in the first modification of the fourth embodiment are similar to those of the fourth embodiment.

As described above, in the semiconductor device 1 according to the first modification of the fourth embodiment, some of the capacitor sets CS are formed using the flat plate capacitor FC. In the semiconductor device 1, the capacity of each capacitor set is designed based on the current consumption of the circuit, an amount of allowable voltage fluctuation, and the like. Therefore, when the capacity of the capacitor set close to the circuit becomes a very small value, sufficient performance can be obtained even if the capacitor set close to the circuit is formed by the flat plate capacitor FC. Therefore, the semiconductor device 1 according to the first modification of the fourth embodiment can obtain similar effects as those of the fourth embodiment.

[5-3-2] Second Modification

Figure 31:
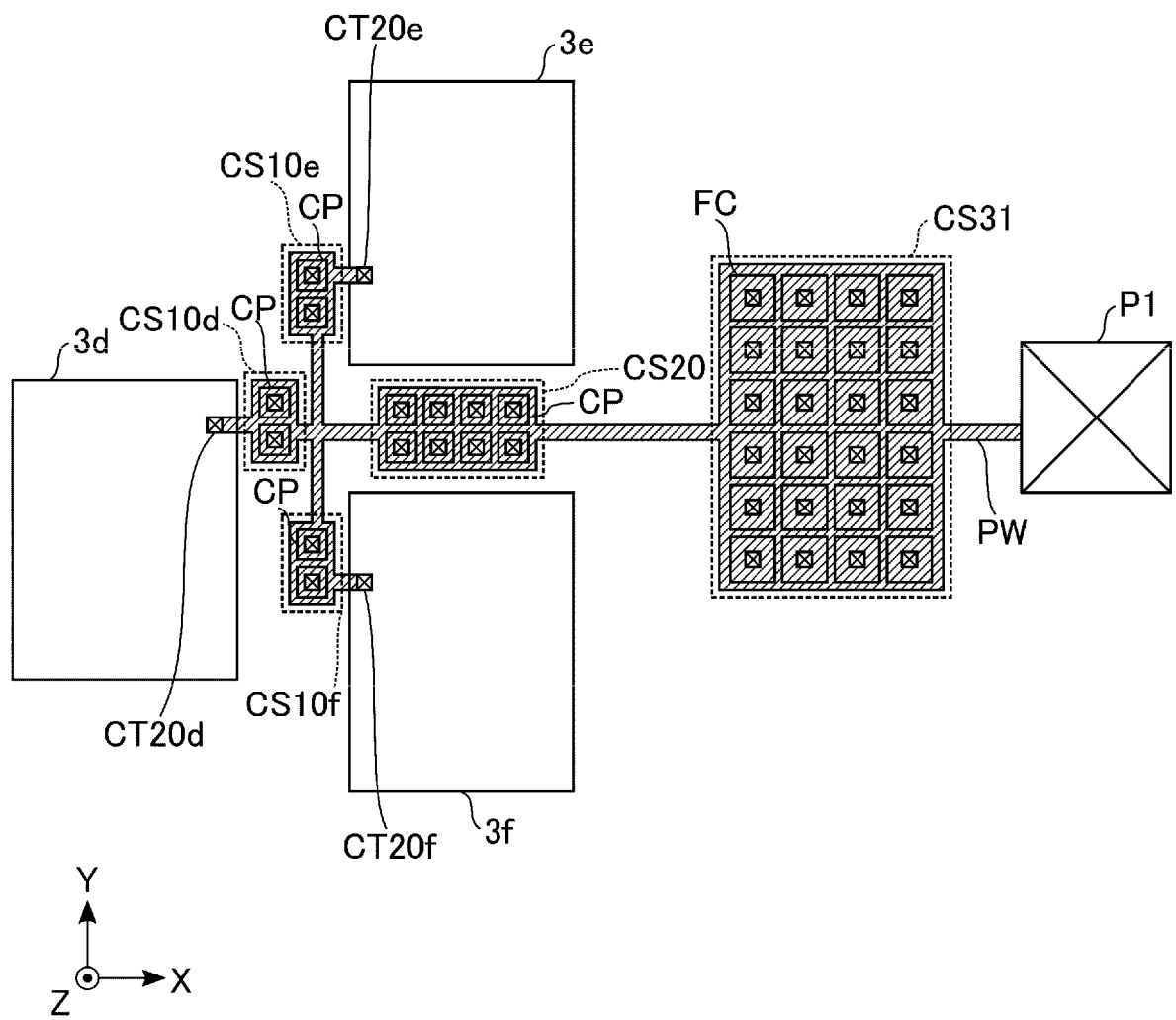
FIG. 31 is a plan view showing an example of a planar layout of the semiconductor device according to a second modification of the fourth embodiment.

FIG. 31 shows an example of a planar layout of the semiconductor device 1 according to a second modification of the fourth embodiment. As shown in FIG. 31, the semiconductor device 1 according to the second modification has a configuration in which the capacitor set CS30 in the semiconductor device 1 according to the fourth embodiment is replaced with a capacitor set CS31.

The capacitor set CS31 includes a flat plate capacitor FC. That is, in the semiconductor device 1 according to the second modification, a capacitor set having a large capacity among the plurality of capacitor sets having different capacities is formed by the flat plate capacitor FC. Similar to the fourth embodiment, the plurality of capacitor sets CS are provided with those having a small capacity close to the circuit and those having a large capacity far from the circuit. Other configurations in the second modification of the fourth embodiment are similar to those of the fourth embodiment.

As described above, in the semiconductor device 1 according to the second modification of the fourth embodiment, some of the capacitor sets CS are formed using the flat plate capacitor FC. In the semiconductor device 1, the area of an area where the capacitor set CS is provided varies depending on the design. Therefore, when the circuits are not densely disposed and a margin presents in the area of the substrate, even a capacitor set having a large capacity can be formed by the flat plate capacitor FC. Therefore, the semiconductor device 1 according to the second modification of the fourth embodiment can obtain similar effects as those of the fourth embodiment.

[5-3-3] Third Modification

Figure 32:
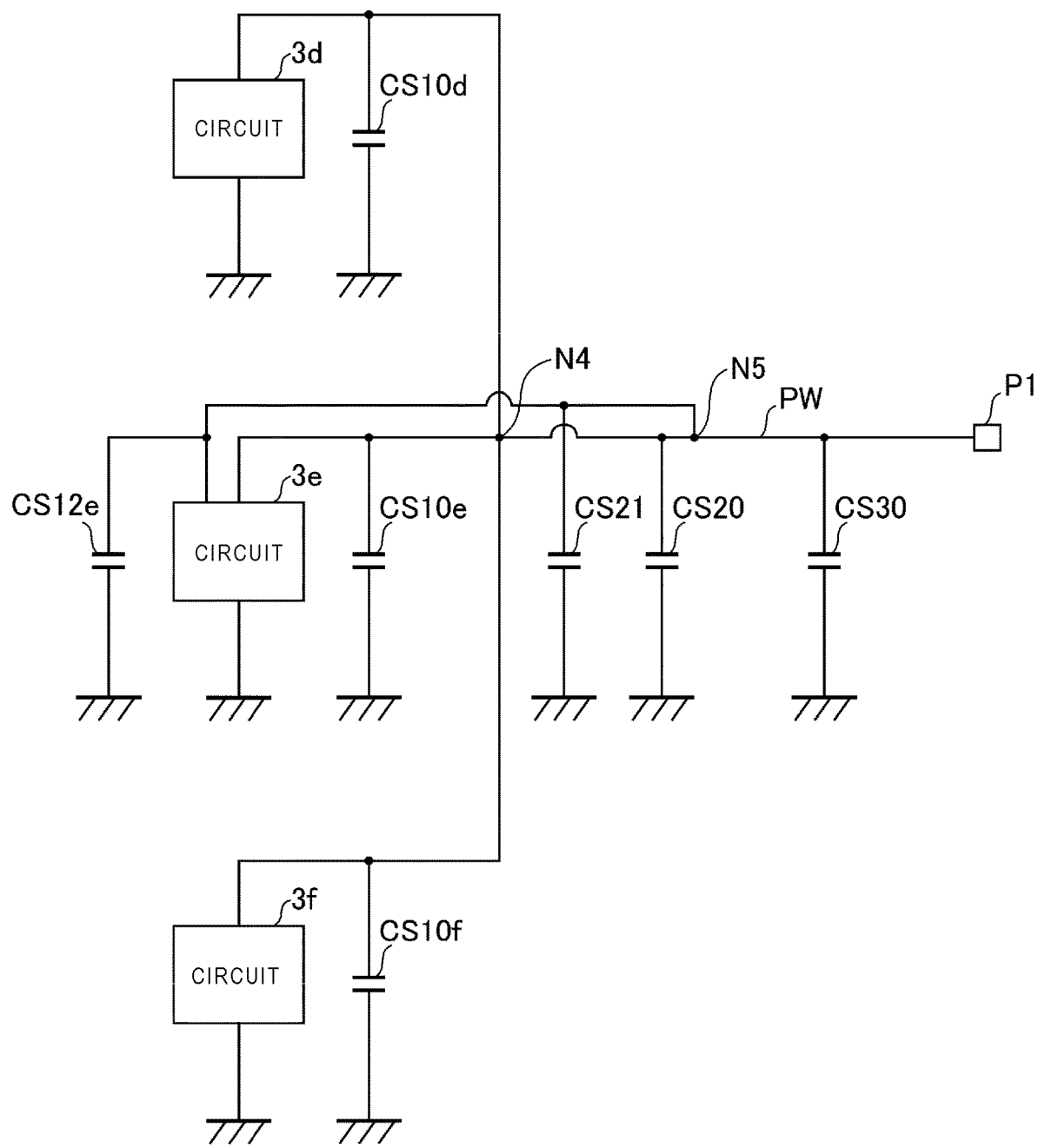
FIG. 32 is a block diagram showing a configuration example of the semiconductor device according to a third modification of the fourth embodiment.

FIG. 32 shows an example of a circuit configuration of the semiconductor device 1 according to a third modification of the fourth embodiment. As shown in FIG. 32, the semiconductor device 1 according to the third modification further includes capacitor sets CS12e and CS21 as the capacitor unit 2 with respect to the semiconductor device 1 according to the fourth embodiment. The power supply line PW further includes a node N5. The circuit 3e further includes a second power supply end. The power supply end of the circuit 3e described in the fourth embodiment is hereinafter referred to as a first power supply end of the circuit 3e, which is distinguished from the second power supply end of the circuit 3e.

The node N5 of the power supply line PW corresponds to a point where one electrode of the capacitor set CS30 is connected and a point to which one electrode of the capacitor set CS20 is connected. The node N5 and the second power supply end of the circuit 3e are connected by the power supply line PW. In the power supply line PW, one electrode of the capacitor set CS21 and one electrode of the capacitor set CS12e are connected in order between the node N5 and the second power supply end of the circuit 3e in a direction from the node N5 to the second power supply end of the circuit 3e.

A capacity of the capacitor set CS12e is substantially equal to a capacity of the capacitor set CS10e, for example. A capacity of the capacitor set CS21 is larger than the capacity of the capacitor set CS12e and smaller than a capacity of the capacitor set CS30. The capacity of the capacitor set CS21 is substantially equal to that of the capacitor set CS20, for example.

Figure 33:
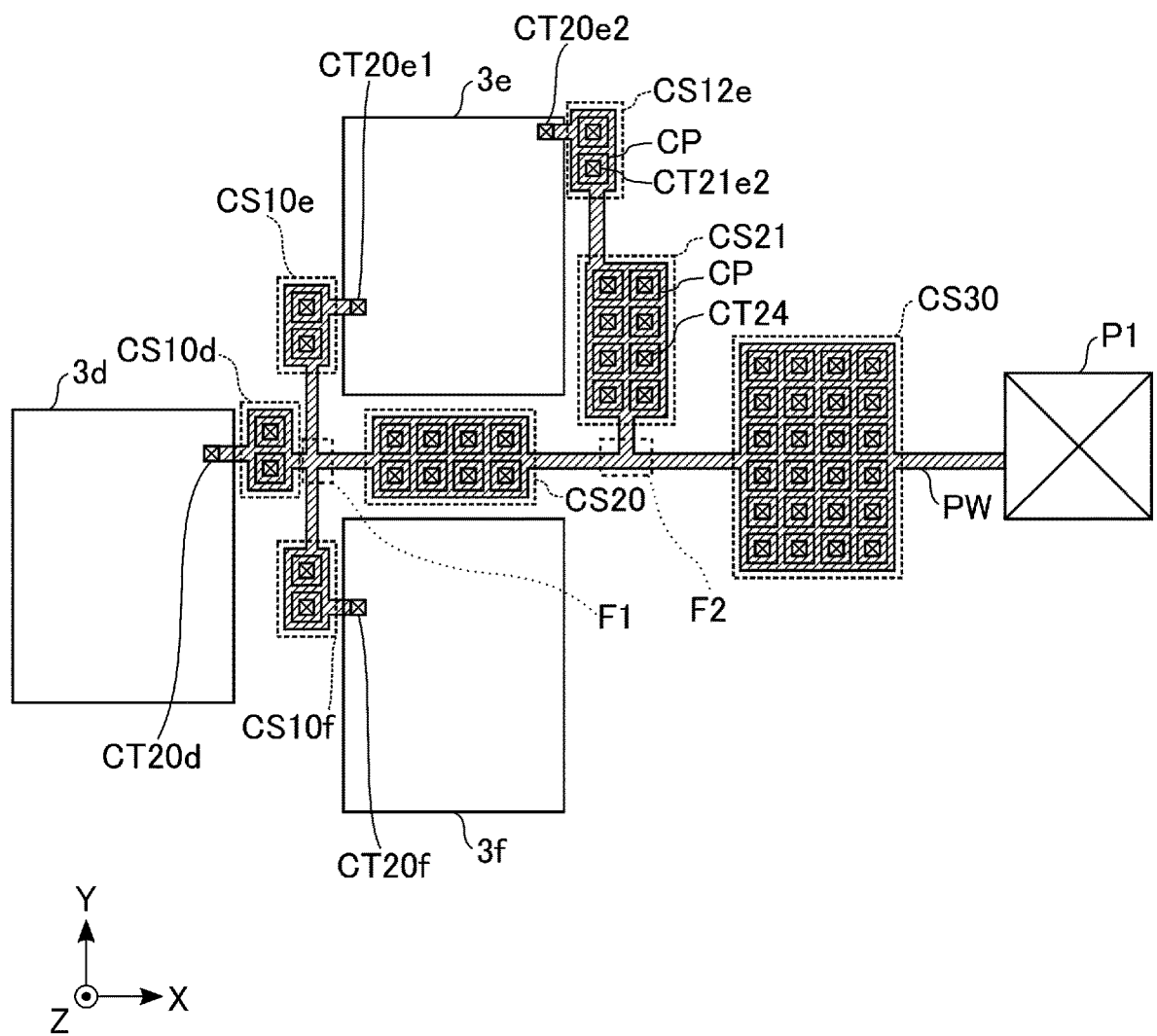
FIG. 33 is a plan view showing an example of a planar layout of the semiconductor device according to the third modification of the fourth embodiment.

FIG. 33 shows an example of a planar layout of the semiconductor device 1 according to the third modification. As shown in FIG. 33, the semiconductor device 1 according to the third modification further includes contact CT20e2, CT21e2, and CT24. The number of capacitors CP in the capacitor set CS12e is equal to the number of capacitors CP in the capacitor set CS10e, for example. The number of capacitors CP in the capacitor set CS21 is equal to the number of capacitors CP in the capacitor set CS20, for example.

The power supply line PW has a branch portion F2 between the capacitor set CS20 and the capacitor set CS30, and extends in the Y direction from the branch portion F2. The branch portion F2 corresponds to the node N5. The capacitor set CS21 and the capacitor set CS12e are disposed in order from the branch portion F2 along the power supply line PW extending from the branch portion F2 in the Y direction.

The contact CT20e2 connects the second power supply end of the circuit 3e and the power supply line PW. The contact CT21e2 connects one electrode of the capacitor set CS12e and the power supply line PW. The contact CT24 connects one electrode of the capacitor set CS21 and the power supply line PW. Other configurations of the semiconductor device 1 according to the third modification are similar to those of the fourth embodiment.

That is, in the semiconductor device 1 according to the third modification, in the power supply line PW connected to the first power supply end and the second power supply end of the circuit 3e, a capacitor set having a smaller capacity is connected closer to the circuit, and a capacitor set having a larger capacity is disposed farther from the circuit. Specifically, in the power supply line PW connecting the first power supply end of the circuit 3e and the pad P1, the capacitor set CS10e, the capacitor set CS20, and the capacitor set CS30 are disposed in order from the first power supply end of the circuit 3e to the pad P1. In the power supply line PW connecting the second power supply end of the circuit 3e and the pad P1, the capacitor set CS12e, the capacitor set CS21, and the capacitor set CS30 are disposed in order from the second power supply end of the circuit 3e to the pad P1.

As described above, in the semiconductor device 1 according to the third modification of the fourth embodiment, when a plurality of different power supply lines are connected to the same circuit block, the capacitor sets are separately disposed on the plurality of power supply lines. Thus, the fine fluctuation of the power supply voltage in the same circuit block can be reduced, and a jitter reduction effect can be promoted. Thus, the semiconductor device 1 according to the third modification of the fourth embodiment can obtain similar effects as those of the fourth embodiment.

A relationship between the capacity of the capacitor set CS12e and the capacity of the capacitor set CS10e, and a relationship between the capacity of the capacitor set CS21 and the capacity of the capacitor set CS20 are not limited to the case of being substantially equal as illustrated in the third modification. The capacity of the capacitor set CS12e and of the capacitor set CS21 can be changed within a range in which the capacity of the capacitor set CS21 is smaller than the capacity of the capacitor set CS30, and the capacity of the capacitor set CS12e is smaller than the capacity of the capacitor set CS21.

[5-3-4] Fourth Modification

Figure 34:
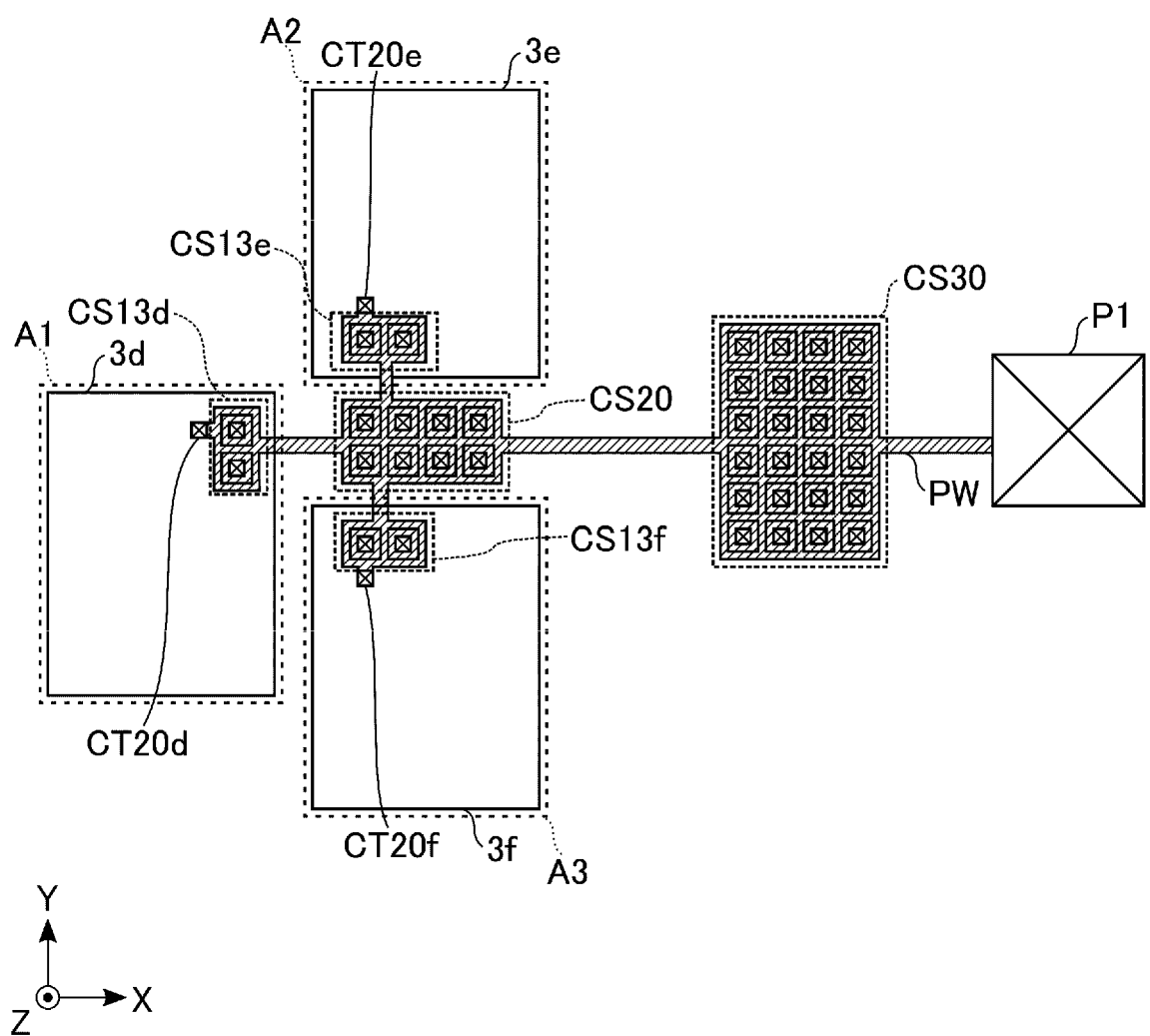
FIG. 34 is a plan view showing an example of a planar layout of the semiconductor device according to a fourth modification of the fourth embodiment.

FIG. 34 shows an example of a planar layout of the semiconductor device 1 according to a fourth modification of the fourth embodiment. As shown in FIG. 34, the semiconductor device 1 according to the fourth modification has a configuration in which the capacitor sets CS10d, CS10e, and CS10f in the semiconductor device 1 according to the fourth embodiment is replaced with capacitor sets CS13d, CS13e, and CS13f.

Each of the circuits 3d, 3e, and 3f is formed by a plurality of elements constituting a circuit, for example, a transistor, a resistor, and a capacitor. A plurality of elements in the circuit 3d are disposed in a circuit area A1 on the substrate. The capacitor set CS13d is disposed in the circuit area A1. For example, the capacitor set CS13d is surrounded by the elements in the circuit 3d.

A plurality of elements in the circuit 3e are disposed in a circuit area A2 on the substrate. The capacitor set CS13e is disposed in the circuit area A2. For example, the capacitor set CS13e is surrounded by the elements in the circuit 3e.

A plurality of elements in the circuit 3f are disposed in a circuit area A3 on the substrate. The capacitor set CS13f is disposed in the circuit area A3. For example, the capacitor set CS13f is surrounded by the elements in the circuit 3f. In other words, each of the capacitor sets CS13d, CS13e, and CS13f is disposed in an area where each of the circuits 3d, 3e, and 3f is provided.

In the semiconductor device 1 according to the fourth modification described above, a capacitor set having a small capacity among the plurality of capacitor sets having different capacities is provided in an area where a circuit is provided. Thus, the distance between the power supply end of the circuit and the capacitor set having a small capacity can be shortened, the fluctuation of the power supply voltage can be further reduced, and the jitter can be further reduced. Therefore, the semiconductor device 1 according to the fourth modification of the fourth embodiment can obtain similar effects as those of the fourth embodiment.

[5-3-5] Fifth Modification

Figure 35:
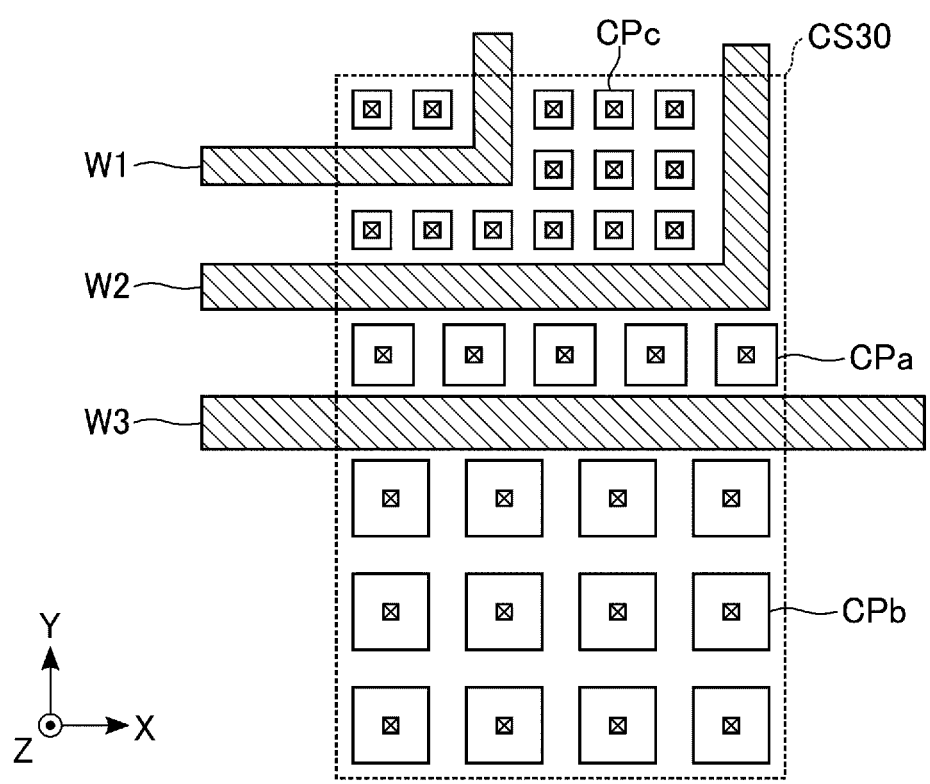
FIG. 35 is a plan view showing an example of a planar layout of a capacitor set in the semiconductor device according to a fifth modification of the fourth embodiment.

FIG. 35 shows an example of a planar layout of the capacitor set CS30 in the semiconductor device 1 according to a fifth modification of the fourth embodiment. As shown in FIG. 35, the semiconductor device 1 according to the fifth modification further includes wirings W1, W2, and W3 with respect to the semiconductor device 1 according to the fourth embodiment. The capacitor set CS30 includes the capacitors CPa, CPb, and CPc. The capacitors CPa, CPb, and CPc are capacitors having different magnitudes as described with reference to FIG. 26. In FIG. 35, a description of the power supply line PW to which one electrode of the capacitor set CS30 is connected is omitted in order to make the configuration easy to see. Each of the plurality of capacitors in the capacitor set CS30 has one electrode connected to the power supply line PW by the contact CT.

As shown in FIG. 35, the wirings W1, W2, and W3 overlap an area where the capacitor set CS30 is provided. A plurality of capacitors CPa, CPb, and CPc do not overlap the wirings W1, W2, and W3. Specifically, in the vicinity of the wiring W1 and in an area between the wiring W1 and the wiring W2, a plurality of capacitors CPc each having a small size are disposed between the wiring W1 and the wiring W2. A plurality of capacitors CPa are disposed in an area between the wiring W2 and the wiring W3. A plurality of capacitors CPb each having a large size are disposed in an area partitioned by the wiring W3 where other wirings do not exist.

In the semiconductor device 1 according to the fifth modification described above, one capacitor set CS is formed by a plurality of types of capacitors CP having different sizes. The area in which the capacitor set CS is provided can overlap, for example, an area in which the wiring is provided. The wiring and the capacitor CP may not be provided in an overlapping manner. When the capacitor CP avoids the wiring, it is possible to prevent an increase in the area of the capacitor set due to avoiding the wiring by using the capacitors having a plurality of sizes. Therefore, the semiconductor device 1 according to the fifth modification of the fourth embodiment can obtain similar effects as those of the fourth embodiment.

The element that cannot overlap the capacitor CP is not limited to the wiring. For example, the configuration described in the fifth modification is also effective when the capacitor CP avoids the contact connected to the semiconductor substrate, a dummy pattern or the like.

The first to fifth modifications of the fourth embodiment described above may be combined. For example, the first modification and the fifth modification may be combined. The capacitor CP and the flat plate capacitor FC may be combined to form one capacitor set CS.

In the embodiments and modifications described above, some examples are described for the capacitor CP provided along the concave portion CC and with the semiconductor layer 12 and the conductor 13 functioning as one electrode, and for the flat plate capacitor FC provided on the semiconductor substrate and with the semiconductor layer 12 and the conductor 13 functioning as one electrode. An example in which the semiconductor substrate 10 functions as the other electrode of the capacitor CP and the other electrode of the flat plate capacitor FC is described. The capacitor CP may be rephrased as, for example, a trench capacitor. The flat plate capacitor FC may be rephrased as, for example, a planar capacitor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a semiconductor substrate having a first surface, a second surface facing the first surface, and a third surface disposed between the first surface and the second surface;
   a first semiconductor layer disposed along the first surface from the third surface;
   a first conductor disposed on the first semiconductor layer;

a first power supply line electrically connected to the first conductor;

a second power supply line electrically connected to the semiconductor substrate;

a circuit provided on the semiconductor substrate and connected to the first power supply line and the second power supply line, wherein the semiconductor substrate further includes a fourth surface disposed between the first surface and the second surface;

a third semiconductor layer disposed along the first surface from the fourth surface; and a third conductor disposed on the third semiconductor layer and electrically connected to the first power supply line, wherein the first conductor functions as one electrode of a first capacitor, and the semiconductor substrate functions as the other electrode of the first capacitor, the third conductor functions as one electrode of a second capacitor, and the semiconductor substrate also functions as the other electrode of the second capacitor, and a capacity of the second capacitor is larger than a capacity of the first capacitor.

2. The semiconductor device according to claim 1, wherein the circuit further includes a transistor including a gate electrode, the gate electrode including a second semiconductor layer disposed in the same layer as the first semiconductor layer and a second conductor disposed in the same layer as the first conductor.

3. The semiconductor device according to claim 1, wherein the circuit includes a transistor, the transistor including a second semiconductor layer and a second conductor functioning as a gate electrode, the first semiconductor layer and the second semiconductor layer are made of the same material, and the first conductor and the second conductor are made of the same material.

4. The semiconductor device according to claim 1, further comprising:

a plurality of capacitor sets each including a plurality of the capacitors, wherein a capacitor set having the smallest capacity among the plurality of capacitor sets is disposed closest to the circuit.

5. The semiconductor device according to claim 4, wherein the plurality of capacitor sets further include a first capacitor set, and a second capacitor set having a capacity larger than a capacity of the first capacitor set, and the first capacitor set and the second capacitor set are disposed in order of the first capacitor set and the second capacitor set along the first power supply line from the circuit.

6. The semiconductor device according to claim 5, wherein the first capacitor set includes a first number of the capacitors, and the second capacitor set includes a second number of the capacitors that is larger than the first number.

7. The semiconductor device according to claim 5, wherein the plurality of capacitor sets further include a third capacitor set having a capacity larger than the capacity of the second capacitor set, and the third capacitor set is disposed in order of the first capacitor set, the second capacitor set, and the third capacitor set along the first power supply line from the circuit.

8. The semiconductor device according to claim 7, wherein a capacity of the second capacitor set is ten times or more a capacity of the first capacitor set, and a capacity of the third capacitor set is ten times or more the capacity of the second capacitor set.

9. The semiconductor device according to claim 1, wherein the first semiconductor layer is disposed in the one electrode of the first capacitor, and the third semiconductor layer is disposed in the one electrode of the second capacitor.

10. The semiconductor device according to claim 1, further comprising:

a first capacitor set including a plurality of the first capacitors, and a second capacitor set including a plurality of the second capacitors, the second capacitor set having a capacity larger than a capacity of the first capacitor set, wherein the first capacitor set and the second capacitor set are disposed in order of the first capacitor set and the second capacitor set along the first power supply line from the circuit.

11. The semiconductor device according to claim 1, further comprising:

a first pad to which the first power supply line is connected and to which a power supply voltage is applied; and a second pad to which the second power supply line is connected and grounded.

12. The semiconductor device according to claim 1, wherein the circuit is a peripheral circuit of a NAND flash memory.

13. The semiconductor device according to claim 1, further comprising:

a second semiconductor layer disposed on the first surface and far from the first semiconductor layer; and a second conductor disposed on the second semiconductor layer, wherein the second conductor is electrically connected to the first power supply line.

14. The semiconductor device according to claim 13, wherein the first conductor functions as one electrode of a trench capacitor, the second conductor functions as one electrode of a planar capacitor, and the semiconductor substrate functions as an other electrode of the trench capacitor and an other electrode of the planar capacitor.

15. The semiconductor device according to claim 14, wherein the first semiconductor layer is disposed in the one electrode of the trench capacitor, and the second semiconductor layer is disposed in the one electrode of the planar capacitor.

16. The semiconductor device according to claim 14, further comprising:

a plurality of capacitor sets each including a plurality of at least one of the trench capacitors or the planar capacitors, and a capacitor set having the smallest capacity among the plurality of capacitor sets is disposed closest to the circuit.

17. The semiconductor device according to claim 16, wherein
the capacitor set having the smallest capacity includes the planar capacitor and does not include the trench capacitor.

18. The semiconductor device according to claim 16, wherein
the plurality of capacitor sets further include a first capacitor set and a second capacitor set having a capacity larger than a capacity of the first capacitor set, and
the first capacitor set and the second capacitor set are disposed in order of the first capacitor set and the second capacitor set along the first power supply line from the circuit.

19. The semiconductor device according to claim 18, wherein
the plurality of capacitor sets further include a third capacitor set having a capacity larger than the capacity of the second capacitor set, and
the third capacitor set is disposed in order of the first capacitor set, the second capacitor set, and the third capacitor set along the first power supply line from the circuit.

20. The semiconductor device according to claim 19, wherein
the capacity of the second capacitor set is ten times or more the capacity of the first capacitor set, and
the capacity of the third capacitor set is ten times or more the capacity of the second capacitor set.

21. The semiconductor device according to claim 14, further comprising:
a plurality of capacitor sets each including a plurality of at least one of the trench capacitors or planar capacitors, wherein
the circuit is disposed in a first area on the semiconductor substrate, and
a capacitor set having the smallest capacity among the plurality of capacitor sets is disposed in the first area.

22. The semiconductor device according to claim 1, further comprising:
a first capacitor set including a plurality of the first capacitors, and a second capacitor set including a plurality of the first capacitors and a plurality of the second capacitors.

23. The semiconductor device according to claim 22, wherein
a capacity of the second capacitor set is larger than a capacity of the first capacitor set, and
the first capacitor set and the second capacitor set are disposed in order of the first capacitor set and the second capacitor set along the first power supply line from the circuit.

24. A semiconductor device comprising:
a semiconductor substrate having a first surface, a second surface facing the first surface, and a third surface disposed between the first surface and the second surface;
a first semiconductor layer disposed along the first surface from the third surface:
a first conductor disposed on the first semiconductor layer;
a first power supply line electrically connected to the first conductor;
a second power supply line electrically connected to the semiconductor substrate;
a circuit provided on the semiconductor substrate and connected to the first power supply line and the second power supply line;
a second semiconductor layer disposed on the first surface and far from the first semiconductor layer;
a second conductor disposed on the second semiconductor layer, wherein the second conductor is electrically connected to the first power supply line;
wherein
the first conductor functions as one electrode of a trench capacitor,
the second conductor functions as one electrode of a planar capacitor, and
the semiconductor substrate functions as an other electrode of the trench capacitor and an other electrode of the planar capacitor;
a pad connected to the first power supply line; and
first to fifth capacitor sets each including a plurality of at least one of the trench capacitors or planar capacitors, wherein
the circuit includes a first power supply end and a second power supply end which power supply ends are electrically connected to the first power supply line,
the first power supply line includes a first portion from the pad to a branch portion, a second portion from the branch portion to the first power supply end, and a third portion from the branch portion to the second power supply end,
the first capacitor set and the second capacitor set are disposed in the second portion, and the first capacitor set is disposed closer to the first power supply end than the second capacitor set,
the third capacitor set and the fourth capacitor set are disposed in the third portion, and the third capacitor set is disposed closer to the second power supply end than the fourth capacitor set,
the fifth capacitor set is disposed in the first portion,
a capacity of the second capacitor set is larger than a capacity of the first capacitor set,
a capacity of the fourth capacitor set is larger than a capacity of the third capacitor set, and
a capacity of the fifth capacitor set is larger than the capacity of any of the second capacitor set or the fourth capacitor set.

* * * * *